United States Patent
Ren et al.

(10) Patent No.: US 12,237,433 B2
(45) Date of Patent: Feb. 25, 2025

(54) DOUBLE-SIDED SOLAR CELL AND PREPARATION METHOD THEREFOR

(71) Applicant: HENGDIAN GROUP DMEGC MAGNETICS CO., LTD, Zhejiang (CN)

(72) Inventors: Yong Ren, Zhejiang (CN); Yue He, Zhejiang (CN); Hailiang Ren, Zhejiang (CN); Shuai Guo, Zhejiang (CN); Lei Zhang, Zhejiang (CN); Dong Zhou, Zhejiang (CN); Deshuang Chen, Zhejiang (CN)

(73) Assignee: HENGDIAN GROUP DMEGC MAGNETICS CO., LTD, Zhejiang (CN)

( * ) Notice: Subject to any disclaimer, the term of this patent is extended or adjusted under 35 U.S.C. 154(b) by 0 days.

(21) Appl. No.: 18/043,174

(22) PCT Filed: Apr. 19, 2021

(86) PCT No.: PCT/CN2021/088063
§ 371 (c)(1),
(2) Date: Feb. 27, 2023

(87) PCT Pub. No.: WO2022/205523
PCT Pub. Date: Oct. 6, 2022

(65) Prior Publication Data
US 2024/0014340 A1   Jan. 11, 2024

(30) Foreign Application Priority Data
Mar. 29, 2021   (CN) .......................... 202110334916.0

(51) Int. Cl.
*H01L 31/068*   (2012.01)
*H01L 31/032*   (2006.01)

(52) U.S. Cl.
CPC ...... *H01L 31/0684* (2013.01); *H01L 31/0324* (2013.01)

(58) Field of Classification Search
CPC ........... H01L 31/02167; H01L 31/0324; H01L 31/068; H01L 31/0684
See application file for complete search history.

(56) References Cited

U.S. PATENT DOCUMENTS

2010/0311203 A1   12/2010   Borden et al.
2016/0284833 A1   9/2016   Shimizu

FOREIGN PATENT DOCUMENTS

CN   202601629 U   12/2012
CN   106653923 A   5/2017
(Continued)

OTHER PUBLICATIONS

CN 110491954 A English translation as provided by FIT database, translated on Feb. 23, 2024.*
(Continued)

*Primary Examiner* — Golam Mowla
(74) *Attorney, Agent, or Firm* — Andrus Intellectual Property Law, LLP

(57) ABSTRACT

Disclosed are a double-sided solar cell and a preparation method therefor. The double-sided solar cell comprises: a silicon wafer having a PN junction, and a front first silicon oxide layer, a front second silicon oxide layer, a front first nitrogen-containing silicon compound layer, a front second nitrogen-containing silicon compound layer, and a front third silicon oxide layer that are located on one side of an N-type layer of the silicon wafer and are sequentially stacked along a direction away from the silicon wafer; and a passivation layer, a back silicon oxide layer, a back first nitrogen-containing silicon compound layer, and a back second nitrogen-containing silicon compound layer that are located on one side of a P-type layer of the silicon wafer and (Continued)

are sequentially stacked along the direction away from the silicon wafer.

19 Claims, 5 Drawing Sheets

(56) References Cited

FOREIGN PATENT DOCUMENTS

| CN | 106876490 A | 6/2017 |
|---|---|---|
| CN | 106972066 A | 7/2017 |
| CN | 207602585 U | 7/2018 |
| CN | 207624714 U | 7/2018 |
| CN | 109004038 A | 12/2018 |
| CN | 109087956 A | 12/2018 |
| CN | 109148613 A | 1/2019 |
| CN | 109216473 A | 1/2019 |
| CN | 109786477 A | 5/2019 |
| CN | 209119114 U | 7/2019 |
| CN | 110137309 A | 8/2019 |
| CN | 110491954 A | 11/2019 |
| CN | 110546768 A | 12/2019 |
| CN | 110965044 A | 4/2020 |
| CN | 210516735 U | 5/2020 |
| CN | 112382672 A | 2/2021 |
| CN | 112481600 A | 3/2021 |
| CN | 112510100 A | 3/2021 |
| JP | 2013161847 A | 8/2013 |
| JP | 2019129274 A | 8/2019 |
| JP | 2020506529 A | 2/2020 |
| JP | 6793274 B1 | 12/2020 |
| NL | 2022817 A | 5/2019 |

OTHER PUBLICATIONS

CN 109004038 A English translation as provided by FIT database, translated on Feb. 23, 2024.*
CN 109786477 A English Translation provided by FIT database, translated on Apr. 20, 2024.*
CN 110546768 A English translation provided by FIT database, translated on Apr. 20, 2024.*
International Search Report for International Patent Application No. PCT/CN2021/088063, mailed Dec. 29, 2021.
First Office Action for CN Application No. 202110334916.0.
Notice of Reasons for Refusal for Japanese Patent Application No. 2023-513415, dated Feb. 2, 2024.
Extended European Search Report for European Patent Application No. 21934177.3 dated Jul. 5, 2024.

* cited by examiner

DOUBLE-SIDED SOLAR CELL AND PREPARATION METHOD THEREFOR

CROSS-REFERENCE TO RELATED APPLICATIONS

This is a national stage application filed under 37 U.S.C. 371 based on International Patent Application No. PCT/CN2021/088063, filed Apr. 19, 2021, which claims priority to Chinese Patent Application No. 202110334916.0, filed on Mar. 29, 2021, the disclosures of which are incorporated herein by reference in their entireties.

TECHNICAL FIELD

The present application belongs to the technical field of solar cells and relates to a bifacial solar cell and a preparation method therefor.

BACKGROUND

In recent years, more and more attention has been paid to the high-profile problem of reduction in power generation of a photovoltaic system due to potential induced degradation (PID) of a module. This phenomenon was first discovered in 2005 by SunPower Corporation. PID refers to a performance deterioration induced by a leakage current between glass and a packaging material when a module has been subjected to a high voltage for a long time, resulting in module performance to be lower a design standard. In 2010, the National Renewable Energy Laboratory (NREL) in the US and Solon SE found that modules prepared from P-type crystalline silicon cell sheets all had potential PID at a negative bias voltage.

Actual experiences of some photovoltaic power stations indicate that a system voltage of a photovoltaic power generation system has a continuous "PID" effect on the crystalline silicon cell module, a main reason of which is that $Na^+$ ions migrate from glass to a cell surface under a high voltage, resulting in a rapid drop of module power. In recent years, the PID has become one of the important factors affecting the quality of a power station. In severe cases, the PID may cause the power of one module to degrade more than 50%, thus affecting a power output of the entire power station and causing a heavy loss to an investor of the power station. Therefore, the PID of the module has received more and more attention from the photovoltaic industry. In recent years, a bifacial power generation module has been developed and applied widely due to the significantly increased profit that it can bring to the investor of the power station. The PID problem of the bifacial module has received extensive attention from the industry.

A passivation film $AlO_x/Si$ interface on a back side of a Passivated Emitter and Rear Cell (PERC) bifacial cell has a relatively high negative charge density, and a good field passivation effect is formed. In a high temperature and high humidity environment, $Na^+$ ions are precipitated from glass. Under an action of a positive voltage, a cell sheet has a high electric potential, a frame has a low electric potential, and the $Na^+$ ions flow out of the cell sheet and are not enriched on a surface of the cell sheet. At a negative voltage, the cell sheet has a low electric potential, the frame has a high electric potential, and the $Na^+$ ions pass through a packaging material and reach the surface of the cell sheet. The enrichment of the $Na^+$ ions on the back side forms an additional field effect, causing charges in the $AlO_x$ passivation film to be redistributed, resulting in a reduction of the field passivation effect. The results show that, as shown in FIG. 1, the back passivation effect of the cell sheet deteriorates and module power significantly degrades; the closer to the frame of the module, the higher the electric potential applied to the cell, the higher the mobility of the $Na^+$ ions so that cell sheets around the frame have a greater probability of the PID degradation.

CN106876490A discloses a PM-resistant N-type crystalline silicon bifacial cell with high conversion efficiency. A P+ layer, a silicon oxide layer, an aluminum oxide layer and a metal electrode are formed in sequence on a front side of an N-type silicon substrate, and an N+ layer, a silicon nitride layer and a metal electrode are formed in sequence on a back side of the N-type silicon substrate, wherein a compact silicon oxide layer of 20 nm or more exists below a metalized region on the front side. The technical solution disclosed in CN110137309A is as follows: (1) a condition for growing an oxide layer is determined; (2) when a back-side aluminum oxide film coating process is performed using an atomic layer deposition method, it is ensured that aluminum oxide on the back side has a thickness of 2-10 nm; (3) after the aluminum oxide film coating process is performed on the bifacial PERC cell, a back-side silicon nitride film coating process is performed and it is ensured that the coated film of silicon nitride on the back side of the bifacial PERC cell has a thickness of 80-110 nm and a refractive index of 2.12 to 2.3; and (4) after the back-side silicon nitride film coating process is performed on the bifacial PERC cell, a front-side silicon nitride film coating process, a back-side laser grooving process and a screen printing process are performed, and then test and sorting are performed to complete the preparation. CN209119114U provides a PID-resistant bifacial cell, which includes a silicon substrate, a front surface film and a back surface film, where the front surface film and the back surface film are disposed two sides of the silicon substrate, respectively, the front surface film includes a front-side anti-reflection film and a front-side dielectric film which are stacked, and the back surface film includes a back-side anti-reflection film and a back-side dielectric film. The front-side dielectric film and the back-side dielectric film of the PID-resistant bifacial cell can effectively block ion migration, reduce the PID and improve conversion efficiency. (1) Each of the front-side dielectric film and the back-side dielectric film is disposed as a silicon oxide film; (2) each of the front-side dielectric film and the back-side dielectric film has a refractive index of 1.4 to 1.7; (3) each of the front-side dielectric film and the back-side dielectric film has a thickness of 1-10 nm; (4) the back surface film further includes an aluminum oxide film, and the back-side dielectric film, the aluminum oxide film and the back-side anti-reflection film are stacked in sequence in a direction away from the silicon substrate; and (5) each of the front-side anti-reflection film and the back-side anti-reflection film is disposed as any one of a $SiN_x$ film or a $SiO_xN_y$ film.

CN207602585U discloses a packaging structure of a PM-resistant bifacial cell module, which includes glass, an ethylene-vinyl acetate (EVA) film, a bifacial cell, an EVA film and a back-plate. The packaging structure of the bifacial cell module includes a single-glass structure and a double-glass structure, where the single-glass structure includes, from top to bottom, glass, an EVA film, a bifacial cell, an EVA film and a back-plate in sequence, and the double-glass structure includes, from top to bottom, glass, an EVA film, a bifacial cell, an EVA film and glass in sequence, where the back-plate includes a high water-resistance layer, a water-resistance layer and a protective layer, and from top to bottom, is a high water-resistance layer, a water-resistance layer and a protective layer in sequence. CN207624714U discloses a single-glass packaging structure of a PID-resistant bifacial cell, which includes glass, a first packaging film, a bifacial cell, a second packaging film and a back-plate, where the glass, the first packaging film, the bifacial cell, the second packaging film and the back-plate are connected in sequence from top to bottom. The back-plate has three layers, which are, from top to bottom, a polyolefin material doped with titanium dioxide, an electrical insulation and oxygen-resistance layer and a protective layer in sequence. The three layers are connected in sequence from top to bottom. The first packaging film has three layers, which are, from top to bottom, an adhesive layer, a blocking layer and an adhesive layer in sequence. The second packaging film has two layers, which are, from top to bottom, an adhesive layer and a blocking layer in sequence. CN109087956A introduces a new bifacial PERC cell structure and a preparation process thereof. The cell has a front-side passivation layer and a back-side passivation layer that are symmetrical in structure, significantly reducing warpage of the bifacial cell and improving a mechanical loading of the module. On the basis of ensuring PID-resistant performance of the cell, a unique surface passivation layer deposition process is adopted for the stacked passivation structure, optimizing front-side and back-side optical (an anti-reflection effect) and electrical (improving a hydrogen passivation effect) performance and improving front-side conversion efficiency, bifaciality and a LID-resistant effect of the cell. Moreover, in the bifacial PERC cell process adopted in the present disclosure, $SiO_2$ layers on the front and back sides are formed simultaneously through thermal oxidation, $AlO_x$ layers on the front and back sides are formed simultaneously through ALD, and $SiN_x/SiN_y/SiO_xN_y/SiO_x$ stacked on the front and back sides are formed through plasma-enhanced chemical vapor deposition (PECVD), respectively, where a deposition order of the front and back sides may be adjusted.

However, several PID-resistant solutions have the following disadvantages: for the description in CN106876490A, the solution first aims at the N-type cell, and the application range is limited; secondly, the solution just adds a compact silicon oxide layer of 20 nm or more, which cannot effectively solve the electric field effect. For the description in CN110137309A, the solution is only described for the bifacial cell structure. A front-side structure includes a $SiN_x$ layer and a silicon oxide layer in sequence, and a back-side structure includes an aluminum oxide layer and a $SiN_x$ film structure in sequence. In this structure solution, the back side has an apparent defect that an enrichment or intrusion of ions cannot be blocked effectively and it is easy to cause a PID-resistant failure of the bifacial PERC cell. For the description in CN209119114U, the solution clarifies that a dielectric layer close to the silicon substrate is a silicon oxide layer, and a refractive index and a thickness are clarified. However, the back-side film structure is described as follows: the back-side dielectric film, the aluminum oxide film and the back-side anti-reflection film are stacked in sequence in the direction away from the silicon substrate. This structure has defects in some films that an ion enrichment on the surface cannot be blocked effectively and the electric field effect will generated. For the description in CN207602585U, the solution only provides a module packaging end. For packaging the bifacial PERC cell into a single-glass module and a double-glass module, a packaging material used is designed and described to achieve the PID-resistant effect, and a corresponding improvement on a bifacial PERC cell end is not described. For the description in CN207624714U, the solution focuses on an introduction that a module packaging material used in single-glass module packaging of the bifacial PERC cell improves the PID-resistance, and a corresponding improvement on a bifacial PERC cell end is not described. For the description in CN109087956A, the present disclosure focuses on a description of the bifacial PERC cell structure and carries out a detailed description of the layered film of the bifacial cell structure. Firstly, the disclosure has no research and protection for the PID problem, and provides no data support and embodiments; secondly, although the film structure of the bifacial PERC cell is similar to that of the present application, the film structure of the bifacial PERC cell has an apparent film structure defect, mainly because a back-side film in the film structure is a $SiO_2/AlO_x/SiN_x/SiN_y/SiO_xN_y/SiO_x$ stacked structure. One point of the PID failure mechanism of the back side is that the back-side film damage from $Na^+$ ions leads to a failure of the $AlO_x$ passivation layer. The $SiO_2$ film is very effective, which can block the damage from $Na^+$ ions on the $AlO_x$ passivation layer. However, in the solution of CN109087956A, the key $SiO_2$ film is arranged on the side close to the Si substrate, which is apparently not in accordance with a PID-resistant film structure.

SUMMARY

An object of the present application is to provide a bifacial solar cell and a preparation method therefor. The bifacial solar cell provided in the present application adopts a special design of a layered film structure, which enhances the compactness and electrical characteristics of a comprehensive film and can slow down an occurrence of back-side PID very effectively.

To achieve the object, the present application adopts the technical solutions described below.

In a first aspect, the present application provides a bifacial solar cell. The bifacial solar cell includes a silicon wafer having a PN junction, and a front-side first silicon oxide layer, a front-side second silicon oxide layer, a front-side first nitrogen-containing silicon compound layer, a front-side second nitrogen-containing silicon compound layer and a front-side third silicon oxide layer that are located on the N-type side of the silicon wafer and stacked in sequence in a direction away from the silicon wafer; a passivation layer, a back-side silicon oxide layer, a back-side first nitrogen-containing silicon compound layer and a back-side second nitrogen-containing silicon compound layer that are located on the P-type side of the silicon wafer and stacked in sequence in the direction away from the silicon wafer.

In the bifacial solar cell provided in the present application, the front-side first silicon oxide layer functions as an interface passivation layer, the front-side second silicon oxide layer functions as a front-side blocking layer, the front-side first nitrogen-containing silicon compound layer functions as a blocking layer and a light absorption layer at a high refractive index, the front-side second nitrogen-containing silicon compound layer functions as a light absorption layer at an intermediate refractive index, and the front-side third silicon oxide layer functions as a light absorption layer at a low refractive index. The passivation layer functions to improve passivation of a back interface, the back-side silicon oxide layer functions to block an intrusion of external ions, the back-side first nitrogen-containing silicon compound layer functions as a blocking layer and a light absorption layer at a high refractive index, and the back-side second nitrogen-containing silicon compound layer functions as a light absorption layer at a low refractive index. The back-side silicon oxide layer and the back-side first nitrogen-containing silicon compound layer are the most critical structures for solving back-side PID of a bifacial PERC cell. Through research, the inventor found that how to block an enrichment and damage of $Na^+$ ions precipitated from the glass of a module is very critical, especially for a back-side exposed film of the bifacial PERC cell. By optimizing the layered film structure, the compactness and electrical characteristics of a comprehensive film is enhanced, which can slow down an occurrence of the back-side PM very effectively.

Therefore, through the layered film structure optimization of the present application, the front side can effectively block the damage from the $Na^+$ ions, and the back side can effectively slow down the enrichment polarization and damage of the $Na^+$ ions.

As shown in FIG. 2, through establishing and analyzing a PM failure model of the bifacial PERC cell, the inventor found the following problems: ① when the module is at a negative bias voltage, a large amount of $Na^+$ ions in the glass of the module migrate out and move toward a vicinity of the cell under an electric field; ② some of $Na^+$ ions pass through cracks of the front-side non-compact film and intrude a vicinity of the PN junction region, resulting in a damage to the PN junction region (PM-shunt) and a power generation failure of the cell; and ③ some of $Na^+$ ions pass through a gap between cells at the module end, migrate to the back side of the cell and are enriched on the passivation region to form a back-side harmful electric field (PM-polarization), resulting in back-side polarization.

Optional technical solutions of the present application are set forth below and not intended to limit the technical solutions of the present application. Technical objects and beneficial effects of the present application can be better achieved through the optional technical solutions set forth below.

As an optional technical solution of the present application, each of the front-side first silicon oxide layer, the front-side second silicon oxide layer, the front-side third silicon oxide layer and the back-side silicon oxide layer is a $SiO_2$ layer. Optionally, the front-side first silicon oxide layer is a thermal silicon oxide layer. Optionally, the front-side second silicon oxide layer, the front-side third silicon oxide layer and the back-side silicon oxide layer are electrodeposited silicon oxide layers.

As an optional technical solution of the present application, each of the front-side first nitrogen-containing silicon compound layer and the back-side first nitrogen-containing silicon compound layer is a $SiN_{x1}$ layer, where x1 is independently 0.75 to 1.34, for example, 0.75, 0.8, 0.9, 1.0, 1.1, 1.2, 1.3, 1.34 or the like.

Optionally, the front-side second nitrogen-containing silicon compound layer and the back-side second nitrogen-containing silicon compound layer are independently a $SiN_{x2}/SiN_{x3}$ stacked structure stacked in sequence in the direction away from the silicon wafer or a $SiN_{x2}/SiN_{x3}/SiO_xN_y$ stacked structure stacked in sequence in the direction away from the silicon wafer, where x2 is 0.75 to 1.34, for example, 0.75, 0.8, 0.9, 1.0, 1.1, 1.2, 1.3, 1.34 or the like, x3 is 0.75 to 1.34, for example, 0.75, 0.8, 0.9, 1.0, 1.1, 1.2, 1.3, 1.34 or the like, x is 1 to 2, for example, 1, 1.5, 2 or the like, y is 1 to 2, for example, 1, 1.5, 2 or the like, and x1>x2>x3.

Optionally, the front-side second nitrogen-containing silicon compound layer is the $SiN_{x2}/SiN_{x3}/SiO_xN_y$ stacked structure stacked in sequence in the direction away from the silicon wafer, and the back-side second nitrogen-containing silicon compound layer is the $SiN_{x2}/SiN_{x3}$ stacked structure stacked in sequence in the direction away from the silicon wafer.

Optionally, the passivation layer is an aluminum oxide layer.

Optionally, the bifacial solar cell further includes a silver electrode. Optionally, a silver electrode on the N-type side of the silicon wafer passes through the front-side first silicon oxide layer, the front-side second silicon oxide layer, the front-side first nitrogen-containing silicon compound layer, the front-side second nitrogen-containing silicon compound layer and the front-side third silicon oxide layer. Optionally, a silver electrode on the P-type side of the silicon wafer passes through the back-side silicon oxide layer, the back-side first nitrogen-containing silicon compound layer and the back-side second nitrogen-containing silicon compound layer.

As an optional technical solution of the present application, the front-side second silicon oxide layer has a refractive index of 1.4 or more, for example, 1.4, 1.5, 1.6, 1.7 or the like. In the present application, if the front-side second silicon oxide layer has too low a refractive index, the front-side second silicon oxide layer has poor film compactness, affecting a blocking effect of the film on the external ions. Optionally, the front-side second silicon oxide layer has a thickness of 5 nm or more, for example, 5 nm, 6 nm, 7 nm, 8 nm, 9 nm, 10 nm or the like. In the present application, if the front-side second silicon oxide layer has too low a thickness, the film is not compact enough, affecting the blocking effect of the film on the external ions.

Optionally, the front-side first nitrogen-containing silicon compound layer has a refractive index of 2.0 or more, for example, 2.0, 2.1, 2.2, 2.3, 2.4 or the like. In the present application, if the front-side first nitrogen-containing silicon compound layer has too low a refractive index, film compactness is not enough, affecting a blocking effect of the film on the external intruding ions. Optionally, the front-side first nitrogen-containing silicon compound layer has a thickness of 15 nm or more, for example, 15 nm, 16 nm, 17 nm, 18 nm, 19 nm or the like. In the present application, if the front-side first nitrogen-containing silicon compound layer has too low a thickness, the film compactness is not enough, affecting the blocking effect of the film on the external intruding ions.

Optionally, the front-side third silicon oxide layer has a refractive index of 1.4 or more, for example, 1.4, 1.5, 1.6, 1.7, 1.8 or the like. In the present application, if the front-side third silicon oxide layer has too low a refractive index, a light absorption mismatch is caused, finally affecting photoelectric conversion efficiency of the solar cell. Optionally, the front-side third silicon oxide layer has a thickness of 5 nm or more, for example, 5 nm, 6 nm, 7 nm, 8 nm, 9 nm, 10 nm or the like. In the present application, if the front-side third silicon oxide layer has too low a thickness, the light absorption mismatch is caused, finally affecting the photoelectric conversion efficiency of the solar cell.

In the present application, the design optimization of the front-side second silicon oxide layer, the front-side first nitrogen-containing silicon compound layer and the front-side third silicon oxide layer can effectively block the $Na^+$ ions from passing through cracks of the front-side non-compact film, and if the Na ions intrude to the vicinity of the PN junction region, it will damage the PN junction region, finally resulting in a PM-resistant failure of the cell.

As an optional technical solution of the present application, the passivation layer has a thickness of 10 nm or more, for example, 10 nm, 11 nm, 12 nm, 13 nm, 14 nm, 15 nm or the like. In the present application, if the passivation layer has too low a thickness, on the one hand, a passivation effect is affected, and on the other hand, the cell is relatively sensitive to the intrusion and enrichment of the external ions.

Optionally, the back-side silicon oxide layer has a refractive index of 1.4 or more, for example, 1.4, 1.5, 1.6, 1.7, 1.8 or the like. In the present application, if the back-side silicon oxide layer has too low a refractive index, film compactness is poor, affecting a blocking effect of the film on the external ions. Optionally, the back-side silicon oxide layer has a thickness of 5 nm or more, for example, 5 nm, 6 nm, 7 nm, 8 nm, 9 nm, 10 nm or the like. If the back-side silicon oxide has too low a thickness, the film compactness is poor, affecting the blocking effect of the film on the external ions.

Optionally, the back-side first nitrogen-containing silicon compound layer has a refractive index of 2.0 or more, for example, 2.0, 2.1, 2.2, 2.3, 2.4, 2.5 or the like. In the present application, if the back-side first nitrogen-containing silicon compound layer has too low a refractive index, film compactness is poor, affecting a blocking effect of the film on the external ions. Optionally, the back-side first nitrogen-containing silicon compound layer has a thickness of 10 nm or more, for example, 10 nm, 11 nm, 12 nm, 13 nm, 14 nm, 15 nm or the like. If the back-side first nitrogen-containing silicon compound layer has too low a thickness, the film compactness is poor, affecting the blocking effect of the film on the external ions.

In the present application, the design optimization of the passivation layer, the back-side silicon oxide layer and the back-side first nitrogen-containing silicon compound layer can effectively resist the polarization caused by the electric field effect generated when the $Na^+$ ions are enriched on the back side.

In a second aspect, the present application provides a method for preparing the bifacial solar cell according to the first aspect. The method includes the following steps: growing a front-side first silicon oxide layer on the N-type side of a silicon wafer having a PN junction and then performing front-side growth and back-side growth to obtain the bifacial solar cell, where the front-side growth includes growing a front-side second silicon oxide layer, a front-side first nitrogen-containing silicon compound layer, a front-side second nitrogen-containing silicon compound layer and a front-side third silicon oxide layer in sequence, and the back-side growth includes growing a passivation layer, a back-side silicon oxide layer, a back-side first nitrogen-containing silicon compound layer and a back-side second nitrogen-containing silicon compound layer in sequence. The preparation method provided in the present application is mature in technology, simple in process and suitable for industrial large-scale production.

As an optional technical solution of the present application, a method for growing the front-side second silicon oxide layer is a thermal oxidation method.

Optionally, each of the front-side growth and the back-side growth is a plasma enhanced chemical vapor deposition (PECVD) growth. In the present application, advantages of using a PECVD method are as follows: film formation is fast, which is conducive to mass production; 2. a gas flow and a chemical bond ratio can be adjusted flexibly; and 3. a multilayer film structure can be achieved in the same furnace tube.

Optionally, the preparation method further includes preparing a silver electrode after the front-side growth and the back-side growth.

As an optional technical solution of the present application, the back-side growth includes: before growing the passivation layer, placing the silicon wafer which has a PN junction and grows the front-side first silicon oxide layer in a PECVD furnace, performing a vacuumizing test, a leak detection and a pressure maintaining test, introducing a working gas, setting a temperature of the reactor to 310-330° C., for example, 310° C., 320° C., 330° C. or the like, setting a pressure to 1450-1550 Pa, for example, 1450 Pa, 1480 Pa, 1500 Pa, 1520 Pa, 1550 Pa or the like, and keeping the temperature and the pressure constant for 9-11 s, for example, 9 s, 10 s, 11 s or the like. Optionally, the working gas includes laughing gas.

Optionally, a method for growing the passivation layer includes: setting a temperature to 310-330° C., for example, 310° C., 320° C., 330° C. or the like, setting a pressure to 1450-1550 Pa, for example, 1450 Pa, 1480 Pa, 1500 Pa, 1520 Pa, 1550 Pa or the like, introducing a working gas and a feed gas of the passivation layer, keeping the temperature and the pressure for 170-190 s, 170 s, 180 s, 190 s or the like, performing vacuumizing for 45-55 s, for example, 45 s, 50 s, 55 s or the like, setting the temperature to 470-490° C., for example, 470° C., 480° C., 490° C. or the like, setting the pressure to 850-950 Pa, for example, 850 Pa, 900 Pa, 950 Pa or the like, introducing the working gas and ammonia, keeping the temperature and the pressure constant for 9-11 s, for example, 9 s, 10 s, 11 s or the like, and then maintaining the temperature, the pressure, an introduction flow of the working gas and an introduction flow of ammonia for 340-360 s, for example, 340 s, 350 s, 360 s or the like, to obtain the passivation layer. Optionally, the working gas includes laughing gas. Optionally, the feed gas of the passivation layer includes trimethylaluminium (TMA).

Optionally, a method for growing the back-side silicon oxide layer includes: setting a temperature to 470-490° C., for example, 470° C., 480° C., 490° C. or the like, setting a pressure to 1450-1550 Pa, for example, 1450 Pa, 1500 Pa, 1550 Pa or the like, introducing a working gas and a silicon feed gas, keeping the temperature and the pressure constant for 75-85 s, for example, 75 s, 80 s, 85 s or the like, then performing vacuumizing for 290-310 s, for example, 280 s, 300 s, 310 s or the like, setting the temperature to 470-490° C., for example, 470° C., 480° C., 490° C. or the like, setting the pressure to 1600-1800 Pa, for example, 1600 Pa, 1700 Pa, 1800 Pa or the like, introducing the silicon feed gas and ammonia and keeping the temperature and the pressure constant for 9-11 s, for example, 9 s, 10 s, 11 s or the like, to obtain the back-side silicon oxide layer. Optionally, the working gas includes laughing gas. Optionally, the silicon feed gas includes silane.

Optionally, a method for growing the back-side first nitrogen-containing silicon compound layer includes: setting a temperature to 470-490° C., setting a pressure to 1650-1750 Pa, for example, 1650 Pa, 1700 Pa, 1750 Pa or the like, introducing ammonia and a silicon feed gas and keeping the temperature and the pressure constant for 235-245 s, for example, 235 s, 240 s, 245 s or the like, to obtain the back-side first nitrogen-containing silicon compound layer. Optionally, the silicon feed gas includes silane.

Optionally, a method for growing the back-side second nitrogen-containing silicon compound layer includes: setting a temperature to 470-490° C., for example, 470° C., 480° C., 490° C. or the like, setting a pressure to 1650-1750 Pa, for example, 1650 Pa, 1700 Pa, 1750 Pa or the like, introducing ammonia and a silicon feed gas, keeping the temperature and the pressure constant for 125-135 s, for example, 125 s, 130 s, 135 s or the like, setting the temperature to 470-490° C., for example, 470° C., 480° C., 490° C. or the like, setting the pressure to 1650-1750 Pa, for example, 1650 Pa, 1700 Pa, 1750 Pa or the like, reducing an introduction flow of the silicon feed gas, increasing an introduction flow of ammonia and keeping the temperature and the pressure constant for 125-135 s, for example, 125 s, 130 s, 135 s or the like, to obtain the back-side second nitrogen-containing silicon compound. Optionally, the silicon feed gas includes silane.

Optionally, the back-side growth further includes: after growing the back-side second nitrogen-containing silicon compound layer, performing vacuumizing and filling with a protective gas back to normal pressure and taking out a product.

As an optional technical solution of the present application, the front-side growth includes: before growing the front-side second silicon oxide layer, placing the silicon wafer which has the a PN junction and grows the front-side first silicon oxide layer in a PECVD furnace, performing vacuumizing, a leak detection, and re-vacuumizing, introducing a working gas and a silicon feed gas, setting a temperature of the reactor to 490-510° C., for example, 490° C., 500° C., 510° C. or the like, setting a pressure to 195-205 Pa, for example, 195 Pa, 200 Pa, 205 Pa or the like, and keeping the temperature and the pressure constant for 15-25 s, for example, 15 s, 20 s, 25 s or the like. Optionally, the working gas includes laughing gas. Optionally, the silicon feed gas includes silane.

Optionally, a method for growing the front-side second silicon oxide layer includes: setting a temperature to 490-510° C., for example, 490° C., 500° C., 510° C. or the like, setting a pressure to 195-205 Pa, for example, 195 Pa, 200 Pa, 205 Pa or the like, introducing a working gas and a silicon feed gas, keeping the temperature and the pressure constant for 75-85 s, for example, 75 s, 80 s, 85 s or the like, then performing vacuumizing for 15-25 s, for example, 15 s, 20 s, 25 s or the like, setting the temperature to 490-510° C., for example, 490° C., 500° C., 510° C. or the like, setting the pressure to 225-235 Pa, for example, 225 Pa, 230 Pa, 235 Pa or the like, introducing the silicon feed gas and ammonia and keeping the temperature and the pressure constant for 15-25 s, for example, 15 s, 20 s, 25 s or the like, to obtain the front-side second silicon oxide layer. Optionally, the working gas includes laughing gas. Optionally, the silicon feed gas includes silane.

Optionally, a method for growing the front-side first nitrogen-containing silicon compound layer includes: setting a temperature to 490-510° C., for example, 490° C., 500° C., 510° C. or the like, setting a pressure to 225-235 Pa, for example, 225 Pa, 230 Pa, 235 Pa or the like, introducing ammonia and a silicon feed gas and keeping the temperature and the pressure constant for 60-70 s, for example, 60 s, 65 s, 70 s or the like, to obtain the front-side first nitrogen-containing silicon compound layer. Optionally, the silicon feed gas includes silane.

Optionally, a method for growing the front-side second nitrogen-containing silicon compound layer includes: setting a temperature to 490-510° C., for example, 490° C., 500° C., 510° C. or the like, setting a pressure to 225-235 Pa, for example, 225 Pa, 230 Pa, 235 Pa or the like, introducing ammonia and a silicon feed gas, keeping the temperature and the pressure constant for 155-165 s, for example, 155 s, 160 s, 165 s or the like, then setting the temperature to 490-510° C., for example, 490° C., 500° C., 510° C. or the like, setting the pressure to 225-235 Pa, for example, 225 Pa, 230 Pa, 235 Pa or the like, reducing an introduction flow of the silicon feed gas, increasing an introduction flow of ammonia, keeping the temperature and the pressure constant for 240-260 s, for example, 240 s, 250 s, 260 s or the like, setting the temperature to 490-510° C., for example, 490° C., 500° C., 510° C. or the like, setting the pressure to 185-195 Pa, for example, 185 Pa, 190 Pa, 195 Pa or the like, introducing the silicon feed gas, ammonia and a working gas, keeping the temperature and the pressure constant for 155-165 s, for example, 155 s, 160 s, 160 s or the like, then performing vacuumizing, introducing the silicon feed gas and the working gas, setting the temperature to 490-510° C., for example, 490° C., 500° C., 510° C. or the like, setting the pressure to 175-185 Pa, for example, 175 Pa, 180 Pa, 185 Pa or the like, and keeping the temperature and the pressure constant for 6-15 s, for example, 6 s, 10 s, 15 s or the like, to obtain the front-side second nitrogen-containing silicon compound layer. Optionally, the silicon feed gas includes silane. The working gas includes laughing gas.

Optionally, a method for growing the front-side third silicon oxide layer includes: setting a temperature to 490-510° C., for example, 490° C., 500° C., 510° C. or the like, setting a pressure to 175-185 Pa, for example, 175 Pa, 180 Pa, 185 Pa or the like, introducing a working gas and a silicon feed gas and keeping the temperature and the pressure constant for 175-185 s, for example, 175 s, 180 s or 185 s. Optionally, the working gas includes laughing gas. Optionally, the silicon feed gas includes silane.

Optionally, the front-side growth further includes: after growing the front-side third silicon oxide layer, performing vacuumizing, cleaning a furnace tube, performing re-vacuumizing back to normal pressure and taking out a product.

As a further optional technical solution of the preparation method of the present application, the method includes the following steps:

growing the front-side first silicon oxide layer on the N-type side of the silicon wafer having a PN junction, performing the front-side growth and the back-side growth and preparing a silver electrode to obtain the bifacial solar cell, where the front-side growth includes growing the front-side second silicon oxide layer, the front-side first nitrogen-containing silicon compound layer, the front-side second nitrogen-containing silicon compound layer and the front-side third silicon oxide layer in sequence; the back-side growth includes growing the passivation layer, the back-side silicon oxide layer, the back-side first nitrogen-containing silicon compound layer and the back-side second nitrogen-containing silicon compound layer in sequence;

each of the front-side growth and the back-side growth is the PECVD growth; the method for growing the passivation layer includes: setting the temperature to 310-330° C., setting the pressure to 1450-1550 Pa, introducing a working gas and a feed gas of the passivation layer, keeping the temperature and the pressure constant for 170-190 s, then performing vacuumizing for 45-55 s, setting the temperature to 470-490° C., setting the pressure to 850-950 Pa, introducing the working gas and ammonia, keeping the temperature and the pressure constant for 9-11 s, then maintaining the temperature, the pressure, the introduction flow of the working gas and the introduction flow of ammonia for 340-360 s to obtain the passivation layer; the method for growing the back-side silicon oxide layer includes: setting the temperature to 470-490° C., setting the pressure to 1450-1550 Pa, introducing the working gas and silicon feed gas, keeping the temperature and the pressure constant for 75-85 s, performing vacuumizing for 290-310 s, setting the temperature to 470-490° C., setting the pressure to 1600-1800 Pa, introducing the silicon feed gas and ammonia and keeping the temperature and the pressure constant for 9-11 s to obtain the back-side silicon oxide layer; the method for growing the back-side first nitrogen-containing silicon compound layer includes: setting the temperature to 470-490°

C., setting the pressure to 1650-1750 Pa, introducing ammonia and the silicon feed gas and keeping the temperature and the pressure constant for 235-245 s to obtain the back-side first nitrogen-containing silicon compound layer; the method for growing the back-side second nitrogen-containing silicon compound layer includes: setting the temperature to 470-490° C., setting the pressure to 1650-1750 Pa, introducing ammonia and the silicon feed gas, keeping the temperature and the pressure constant for 125-135 s, setting the temperature to 470-490° C., setting the pressure to 1650-1750 Pa, reducing the introduction flow of the silicon feed gas, increasing the introduction flow of ammonia and keeping the temperature and the pressure constant for 125-135s to obtain the back-side second nitrogen-containing silicon compound; the method for growing the front-side second silicon oxide layer includes: setting the temperature to 490-510° C., setting the pressure to 195-205 Pa, introducing the working gas and the silicon feed gas, keeping the temperature and the pressure constant for 75-85 s, then performing vacuumizing for 15-25 s, setting the temperature to 490-510° C., setting the pressure to 225-235 Pa, introducing the silicon feed gas and ammonia and keeping the temperature and the pressure constant for 15-25 s to obtain the front-side second silicon oxide layer; the method for growing the front-side first nitrogen-containing silicon compound layer includes: setting the temperature to 490-510° C., setting the pressure to 225-235 Pa, introducing ammonia and the silicon feed gas and keeping the temperature and the pressure constant for 60-70 s to obtain the front-side first nitrogen-containing silicon compound layer; the method for growing the front-side second nitrogen-containing silicon compound layer includes: setting the temperature to 490-510° C., setting the pressure to 225-235 Pa, introducing ammonia and the silicon feed gas, keeping the temperature and the pressure constant for 155-165 s, setting the temperature to 490-510° C., setting the pressure to 225-235 Pa, reducing the introduction flow of the silicon feed gas, increasing the introduction flow of ammonia, keeping the temperature and the pressure for 240-260 s, setting the temperature to 490-510° C., setting the pressure to 185-195 Pa, introducing the silicon feed gas, ammonia and the working gas, keeping the temperature and the pressure constant for 155-165 s, then performing vacuumizing, introducing the silicon feed gas and working gas, setting the temperature to 490-510° C., setting the pressure to 175-185 Pa and keeping the temperature and the pressure constant for 6-15 s to obtain the front-side second nitrogen-containing silicon compound layer; the method for growing the front-side third silicon oxide layer includes: setting the temperature to 490-510° C., setting the pressure to 175-185 Pa, introducing the working gas and the silicon feed gas and keeping the temperature and the pressure constant for 175-185 s.

Compared with the existing art, the present application has the beneficial effects described below.

(1) Based on the existing device, with no additional capital investment and under the premise of ensuring safety, the present application provides a solution for effectively solving the PID-resistant failure of the bifacial PERC cell through the establishment and analysis of the PID failure model. The bifacial solar cell provided in the present application adopts a special design of a layered film structure (including a multilayer design of a front-side film and a multilayer design of a back-side film, where the back-side silicon oxide layer and the back-side first nitrogen-containing silicon compound layer are the most critical structures for solving the back-side PID of the bifacial PERC cell), which enhances the compactness and electrical characteristics of the comprehensive film and can slow down an occurrence of the back-side PID very effectively.

(2) The preparation method of the present application is simple to operate, short in flow and easy to achieve the industrial large-scale production.

REFERENCE LIST

Figure 4:
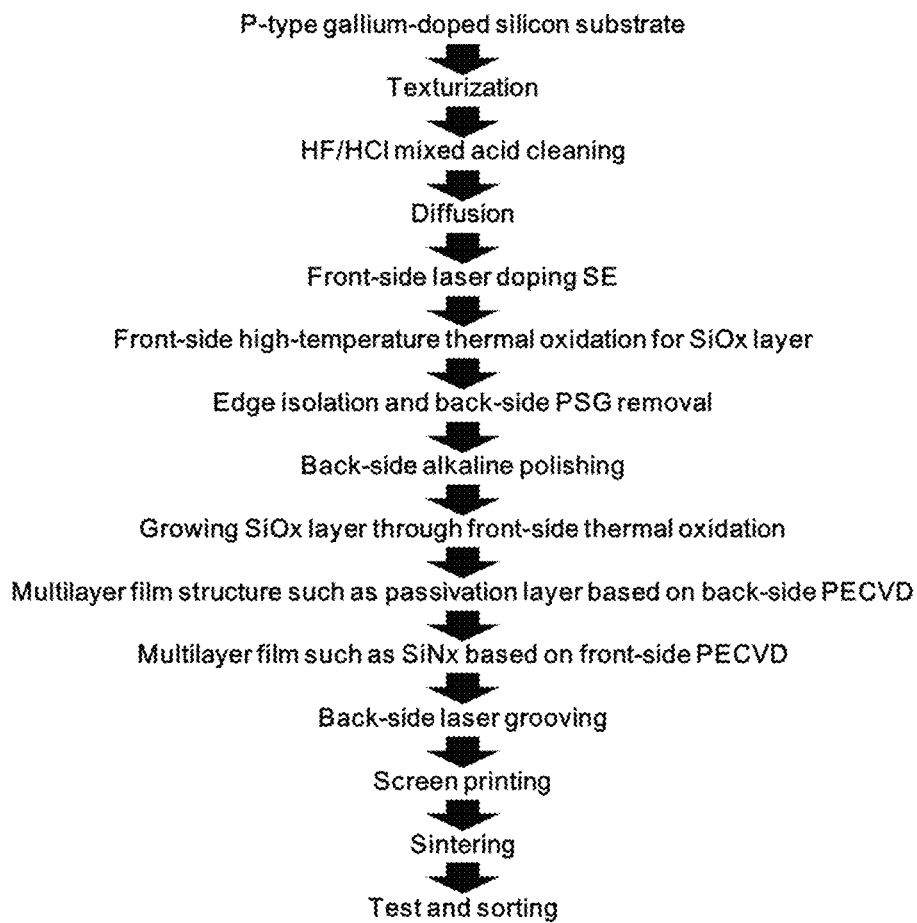

1 silicon wafer having a PN junction
2 passivation layer
3 back-side silicon oxide layer
4 back-side first nitrogen-containing silicon compound layer
5 back-side second nitrogen-containing silicon compound layer
6 front-side first silicon oxide layer
7 front-side second silicon oxide layer
8 front-side first nitrogen-containing silicon compound layer
9 front-side second nitrogen-containing silicon compound layer
10 front-side third silicon oxide layer FIG. 4 is a flowchart of a method for preparing a bifacial solar cell provided in Example 1.

Figure 5:
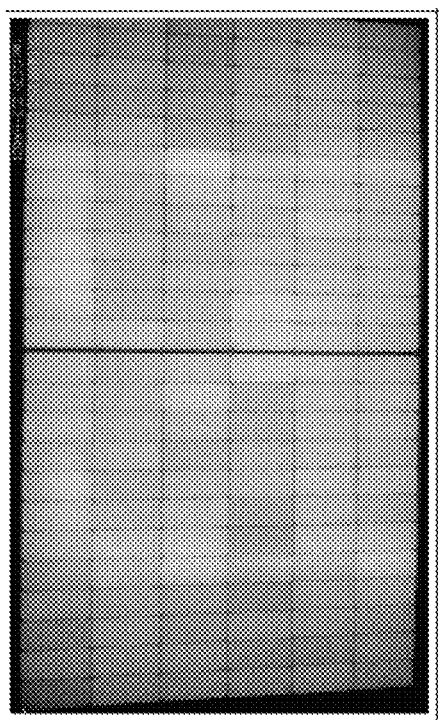
Figure 5:
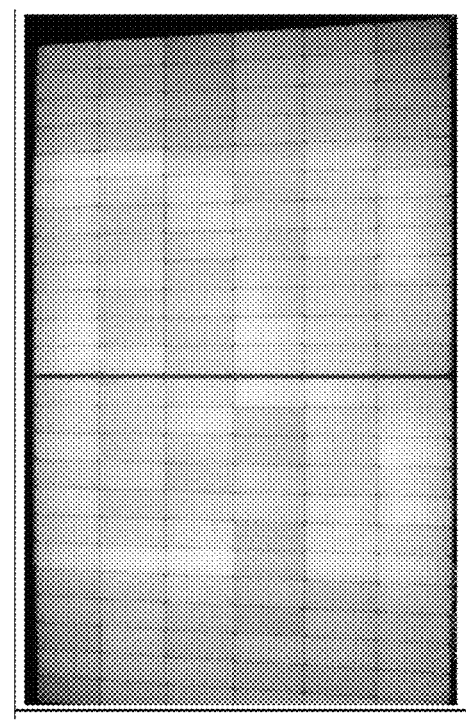
Figure 5:
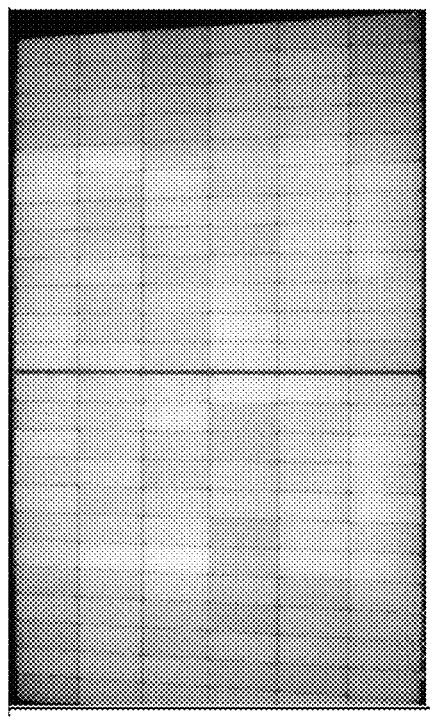
Figure 5:
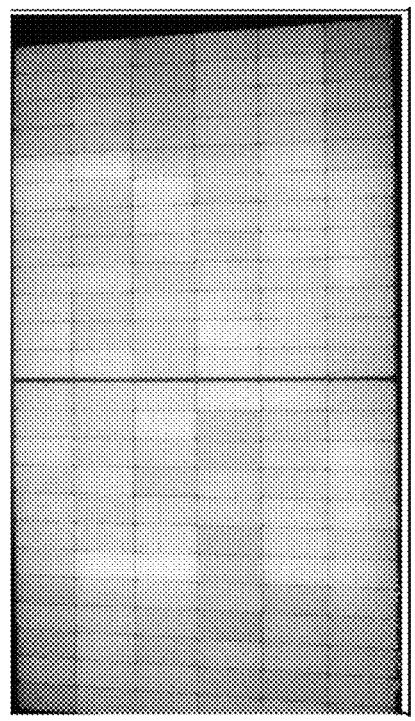

FIG. 5(A) is an initial EL picture of a bifacial solar cell single-glass module provided in Example 1 in a test; FIG. 5(B) is an EL picture of Sample 1# of the bifacial solar cell single-glass module provided in Example 1 after 96 h of PID; FIG. 5(C) is an EL picture of Sample 1# of the bifacial solar cell single-glass module provided in Example 1 after 192 h of PID; and FIG. 5(D) is an EL picture of Sample 1# of the bifacial solar cell single-glass module provided in Example 1 after 288 h of PID.

Figure 6:
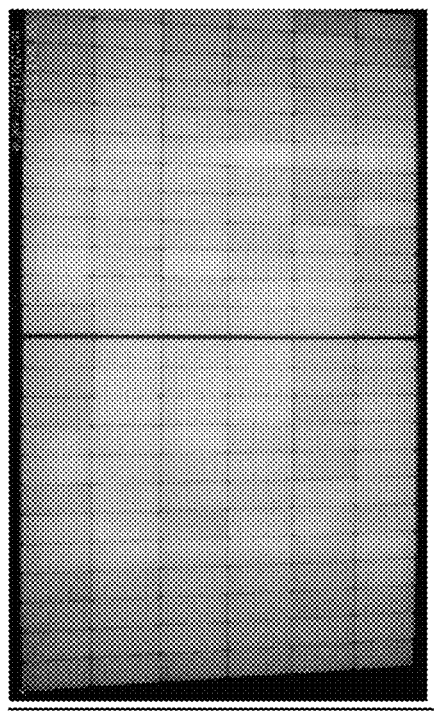
Figure 6:
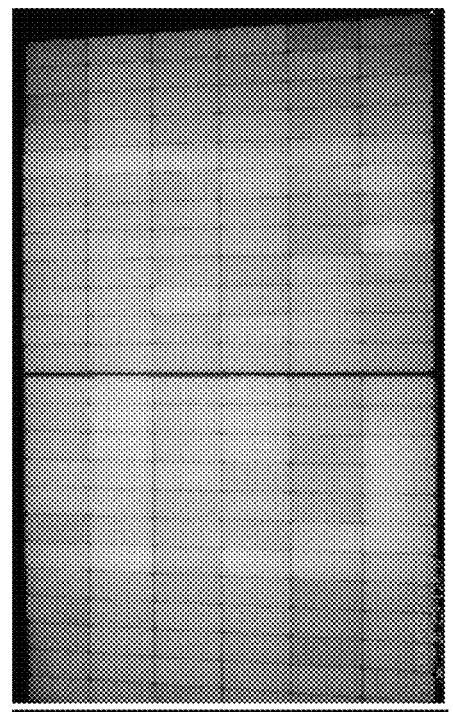
Figure 6:
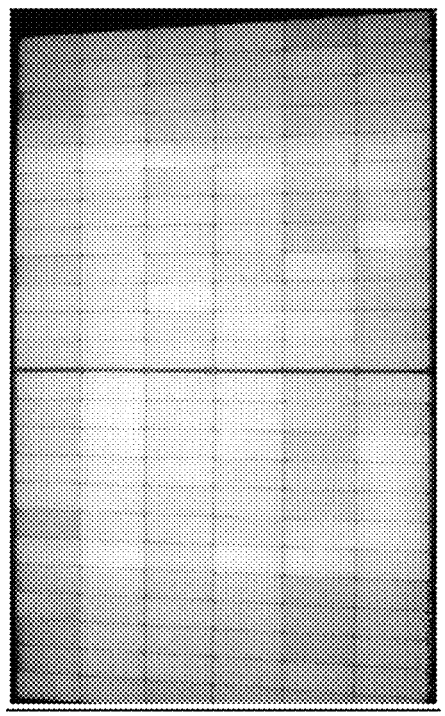
Figure 6:
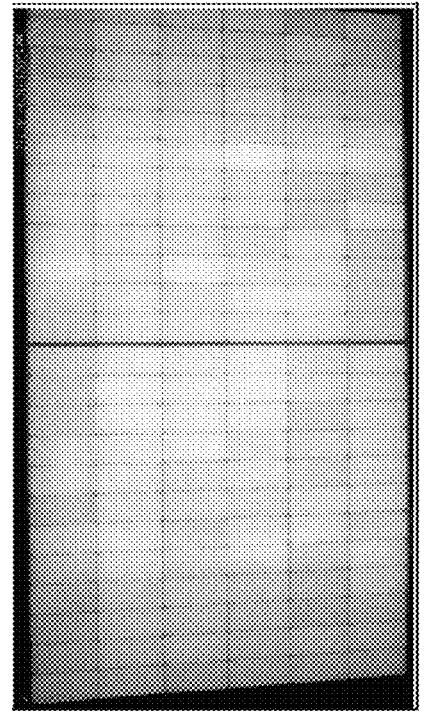

FIG. 6(A) is an initial EL picture of Sample 2# of the bifacial solar cell single-glass module provided in Example 1; FIG. 6(B) is an EL picture of Sample 2# of the bifacial solar cell single-glass module provided in Example 1 after 96 h of PID; FIG. 6(C) is an EL picture of Sample 2# of the bifacial solar cell single-glass module provided in Example 1 after 192 h of PID; and FIG. 6(D) is an EL picture of Sample 2# of the bifacial solar cell single-glass module provided in Example 1 after 288 h of PID.

Figure 7:
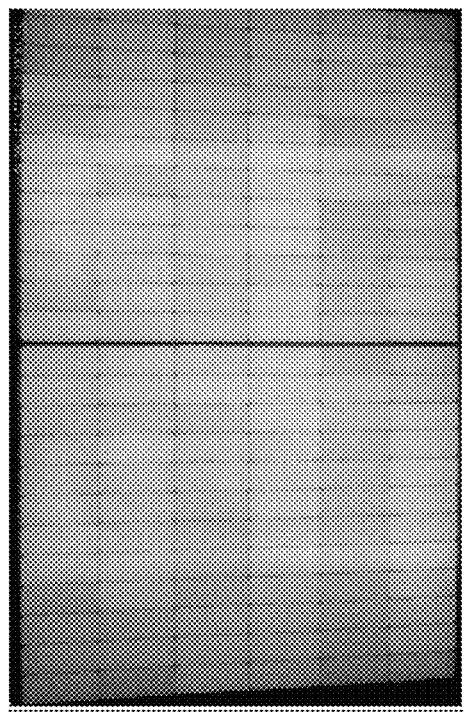
Figure 7:
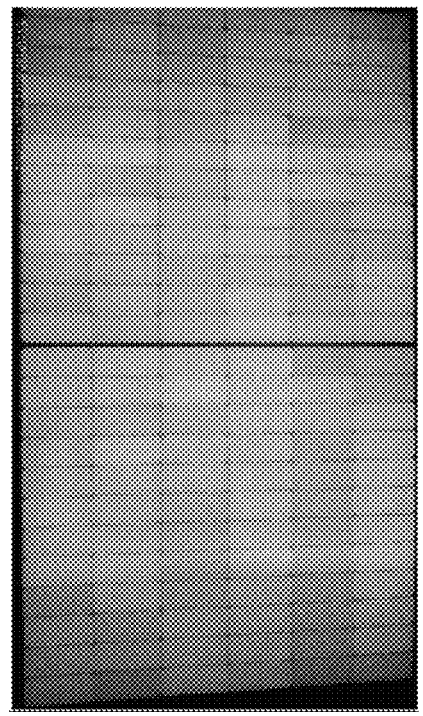
Figure 7:
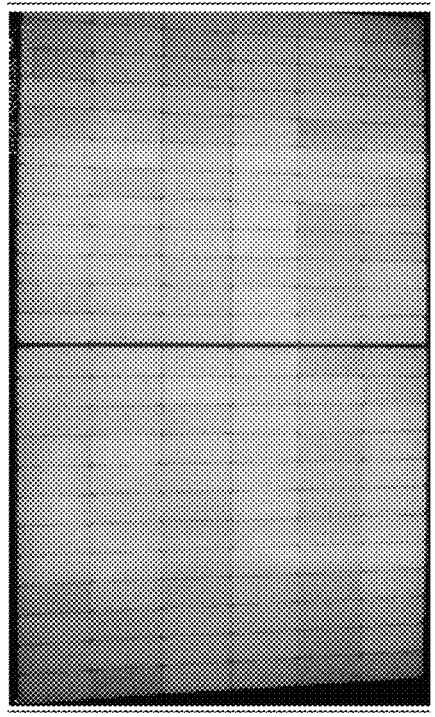
Figure 7:
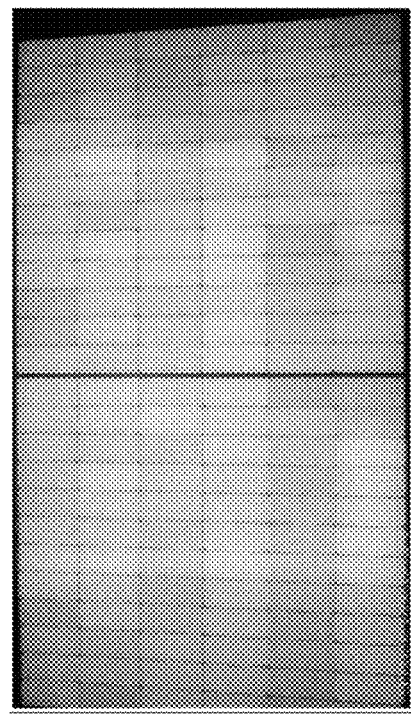

FIG. 7(A) is an initial EL picture of a bifacial solar cell double-glass module provided in Example 1; FIG. 7(B) is an EL picture of the bifacial solar cell double-glass module provided in Example 1 after 96 h of PID; FIG. 7(C) is an EL picture of the bifacial solar cell double-glass module provided in Example 1 after 192 h of PID; and FIG. 7(D) is an EL picture of the bifacial solar cell double-glass module provided in Example 1 after 288 h of PID.

DETAILED DESCRIPTION

To better illustrate the present application and to facilitate the understanding of the technical solutions of the present application, the present application is further described in detail below. The examples described below are merely simple examples of the present application and not intended to represent or limit the scope of the present application. The scope of the present application is defined by the claims. Typical but non-limiting examples of the present application are described below.

Example 1

Figure 1:
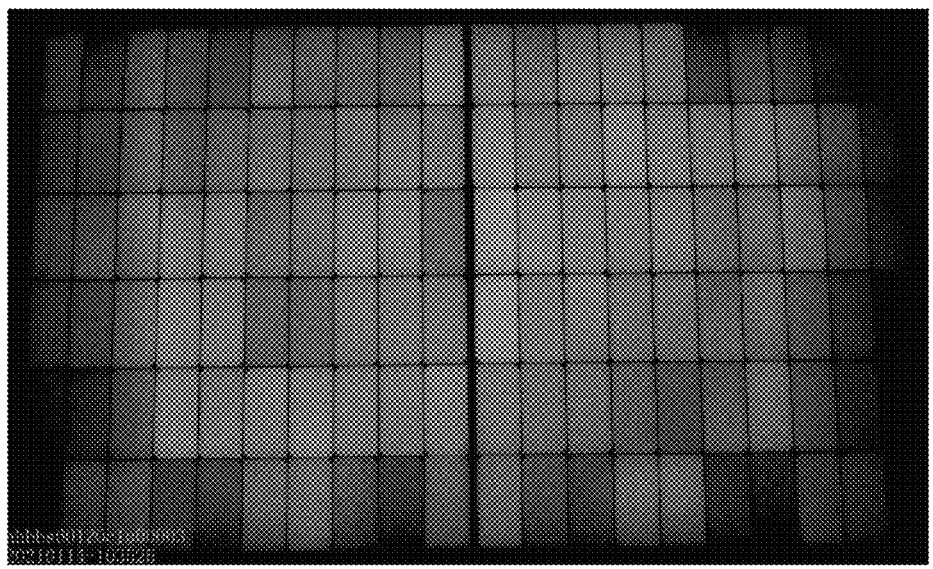
FIG. 1 is an electroluminescence (EL) picture of a failed bifacial cell double-glass module after PID at a bias voltage of −1500 V in laboratory.
Figure 2:
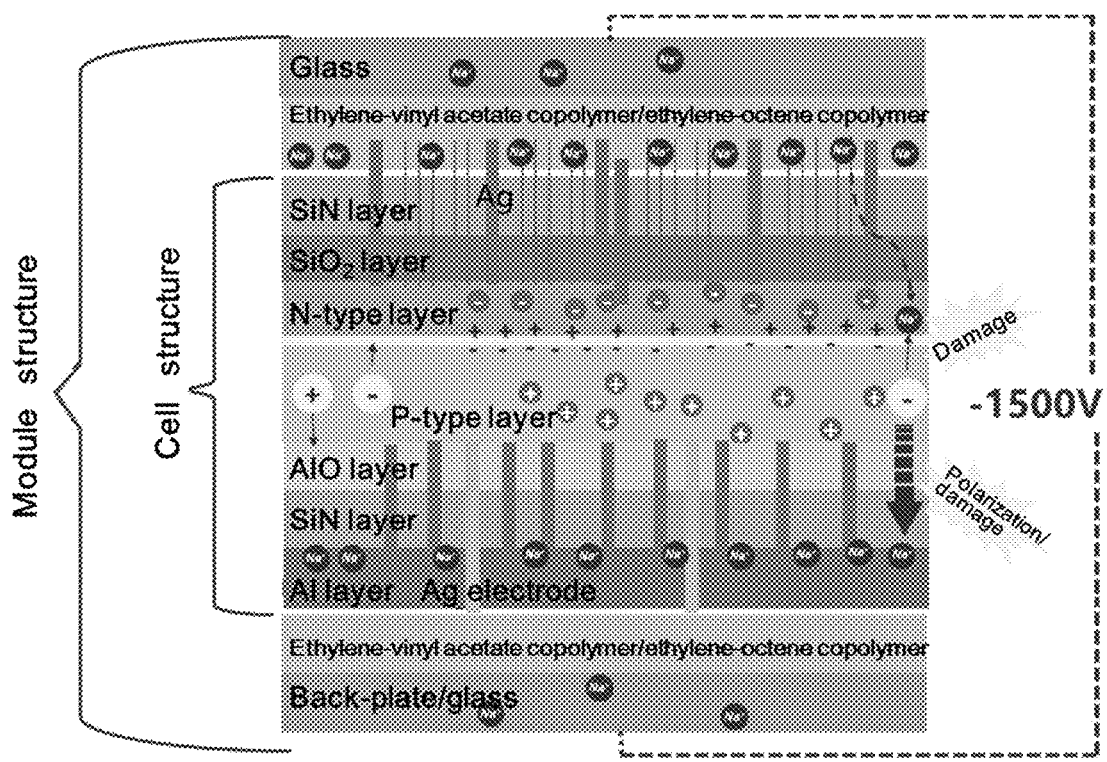
FIG. 2 illustrates a PID failure model of a bifacial PERC cell.
Figure 3:
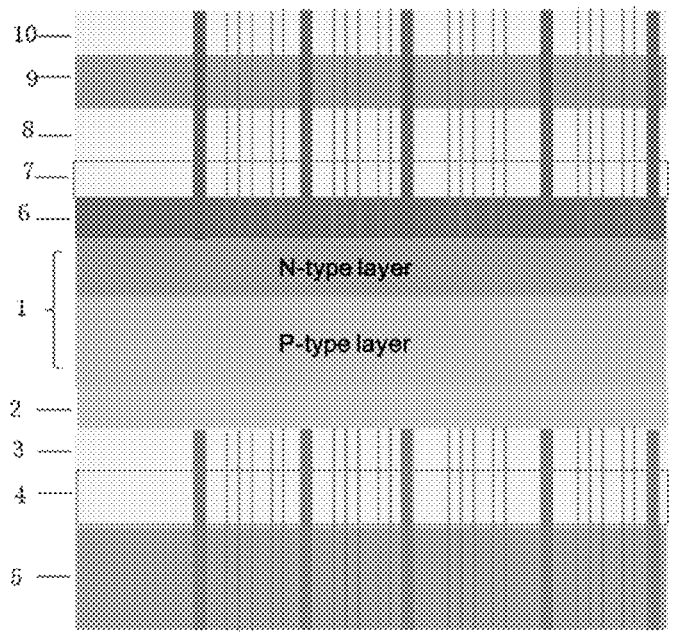
FIG. 3 is a structure diagram of a bifacial solar cell provided in Example 1.

This example provides a bifacial solar cell having a structure as shown in FIG. 3. The bifacial solar cell includes a silicon wafer 1 having a PN junction, and a front-side first silicon oxide layer 6, a front-side second silicon oxide layer 7, a front-side first nitrogen-containing silicon compound layer 8, a front-side second nitrogen-containing silicon compound layer 9 and a front-side third silicon oxide layer 10 that are located on the N-type side of the silicon wafer 1 having a PN junction and stacked in sequence in a direction away from the silicon wafer; a passivation layer 2, a back-side silicon oxide layer 3, a back-side first nitrogen-containing silicon compound layer 4 and a back-side second nitrogen-containing silicon compound layer 5 that are located on the P-type side of the silicon wafer 1 having a PN junction and stacked in sequence in the direction away from the silicon wafer. The bifacial solar cell further includes a silver electrode. A silver electrode on the N-type side of the silicon wafer 1 having a PN junction passes through the front-side first silicon oxide layer, the front-side second silicon oxide layer, the front-side first nitrogen-containing silicon compound layer, the front-side second nitrogen-containing silicon compound layer and the front-side third silicon oxide layer. A silver electrode on the P-type side of the silicon wafer 1 having a PN junction passes through the back-side silicon oxide layer, the back-side first nitrogen-containing silicon compound layer and the back-side second nitrogen-containing silicon compound layer.

In this example, each of the front-side first silicon oxide layer 6, the front-side second silicon oxide layer 7, the front-side third silicon oxide layer 10 and the back-side silicon oxide layer 3 is a $SiO_2$ layer, the front-side first silicon oxide layer 6 is a thermal silicon oxide layer, and the front-side second silicon oxide layer 7, the front-side third silicon oxide layer 10 and the back-side silicon oxide layer 3 are electrodeposited silicon oxide layers. The passivation layer 2 is an aluminum oxide layer ($AlO_x$, x=1.5).

In this example, the front-side first nitrogen-containing silicon compound layer is a $SiN_{x1}$ layer (x1=4/3), and the back-side first nitrogen-containing silicon compound layer is also a $SiN_{x1}$ layer (x1=4/3). The front-side second nitrogen-containing silicon compound layer 9 is a $SiN_{x2}/SiN_{x3}/SiO_xN_y$ stacked structure (x2=4/3, x3=4/3, x=1, y=1) stacked in sequence in the direction away from the silicon wafer 1 having a PN junction. The back-side second nitrogen-containing silicon compound layer 5 is a $SiN_{x2}/SiN_{x3}$ stacked structure (x2=4/3, x3=4/3) stacked in sequence in the direction away from the silicon wafer 1 having a PN junction.

In the bifacial solar cell provided in this example, the front-side second silicon oxide layer 7 has a refractive index of 1.45 and a thickness of 6 nm, the front-side first nitrogen-containing silicon compound layer 8 has a refractive index of 2.2 and a thickness of 20 nm; the front-side third silicon oxide layer 10 has a refractive index of 1.4 and a thickness of 5, the passivation layer 2 has a thickness of 10 nm; the back-side silicon oxide layer 3 has a refractive index of 1.45 and a thickness of 12 nm, and the back-side first nitrogen-containing silicon compound layer 4 has a refractive index of 2.2 and a thickness of 15 nm.

This example further provides a method for preparing a bifacial solar cell. Specific steps are as follows: subjecting a P-type gallium-doped silicon wafer to front-line process (texturization, HF/HCl mixed acid cleaning, diffusion and front-side laser doping SE) to obtain a silicon wafer having a PN junction, growing a front-side first silicon oxide layer on the N-type side of the silicon wafer having a PN junction through a thermal oxidation method and performing a front-side growth, a back-side growth, back-side laser grooving, silver-electrode screen printing and sintering to obtain the bifacial solar cell. A flowchart of the method is shown in FIG. 4.

A method of the back-side growth includes the steps described below.

In (1) step, the silicon wafer after the thermal oxidation process was inserted into a graphite boat and sent into an inner tube of a tubular PECVD furnace through a mechanical arm, where a time was set to 110 s, a temperature was set to 320° C., a pressure was set to 10000 Pa, and a speed of sending the boat was set to 1000 mm/min.

In (2) step, the mechanical arm was pulled from the furnace tube, the furnace tube was closed, and at the same time, a temperature was set to 320° C., and a vacuumizing test, a leak detection and a pressure maintaining test were performed.

In (3) step, the system entered a constant temperature and constant pressure stage, where a time was set to 10 s, a temperature was set to 320° C., a pressure was set to 1500 Pa, and an introduced laughing gas flow was 5800 sccm.

In (4) step, the system entered a deposition stage of aluminum oxide, where a time was set to 180 s, a temperature was set to 320° C., a pressure was set to 1500 Pa, an introduced laughing gas flow was 5800 sccm, an opening degree of trimethylaluminium (TMA) was 75%, a radio frequency power was 7000 W, and a pulse switch ratio was 20/1000.

In (5) step, vacuumizing was performed to evacuate the remaining gas after the reaction, where a time was set to 50 s, a temperature was set to 480° C., and a pressure was set to 0 Pa.

In (6) step, the system entered a second constant temperature and constant pressure stage, where a time was set to 10 s, a temperature was set to 480° C., a pressure was set to 900 Pa, an introduced ammonia flow was 2500 sccm, and an introduced laughing gas flow was 2500 sccm.

In (7) step, an activation pretreatment process of aluminum oxide was performed, that is, partial ion implantation of H passivation was performed on the aluminum oxide grown in step (4), where a time was set to 350 s, a temperature was set to 480° C., a pressure was set to 900 Pa, an introduced ammonia flow was 2500 sccm, an introduced laughing gas flow was 2500 sccm, a radio frequency power was 3500 W, and a pulse switch ratio was 30/120.

In (8) step, the system entered a growth stage of silicon oxide, where a time was set to 80 s, a temperature was set to 480° C., a pressure was set to 1500 Pa, an introduced silane flow was 650 sccm, an introduced laughing gas flow was 5200 sccm, a radio frequency power was 8000 W, and a pulse switch ratio was 36/1000.

In (9) step, vacuumizing was performed to evacuate the remaining gas after the reaction, where a time was set to 300 s, a temperature was set to 480° C., and a pressure was set to 0 Pa.

In (10) step, the system entered a third constant temperature and constant pressure stage, where a time was set to 10 s, a temperature was set to 480° C., a pressure was set to 1700 Pa, an introduced silane flow was 1250 sccm, and an introduced ammonia flow was 4880 sccm.

In (11) step, the system entered a growth stage of a first $SiN_{x1}$ layer having a high refractive index, where a time was set to 240 s, a temperature was set to 480° C., a pressure was set to 1700 Pa, an introduced silane flow was 1250 sccm, an introduced ammonia flow was 4880 sccm, a radio frequency power was 13000 W, and a pulse switch ratio was 50/700.

In (12) step, the system entered a growth stage of a second $SiN_{x2}$ layer, where a time was set to 130 s, a temperature was set to 480° C., a pressure was set to 1700 Pa, an introduced silane flow was 850 sccm, an introduced ammonia flow was 6000 sccm, a radio frequency power was 13000 W, and a pulse switch ratio was 50/600.

In (13) step, the system entered a growth stage of a third $SiN_{x3}$ layer, where a time was set to 130 s, a temperature was set to 480° C., a pressure was set to 1700 Pa, an introduced silane flow was 600 sccm, an introduced ammonia flow was 6500 sccm, a radio frequency power was 13000 W, and a pulse switch ratio was 50/600.

In (14) step, after the process was completed, the system entered a stage of vacuumizing and filling with nitrogen back to normal pressure, where a time was set to 150 s, a temperature was set to 430° C., a pressure was set to 10000 Pa, and an introduced nitrogen flow was 40000 sccm.

In (15) step, a door of the furnace was opened, and the boat was taken out to end the entire back-side PECVD film coating process, where a time was set to 110 s, a temperature was set to 430° C., a pressure was set to 10000 Pa, and a speed of taking out the boat was set to 1000 mm/min.

A method of the front-side growth includes the steps described below.

In (1) step, a boat was sent into a furnace, that is, the silicon wafer was placed on a graphite holder and sent into a tubular PECVD film coating device through a mechanical arm, where a time was set to 120 s, a temperature was set to 500° C., and a pressure was 10000 Pa.

In (2) step, vacuumizing was performed, that is, vacuumizing was performed on a furnace tube for the first time, where a time was set to 200 s, a temperature was set to 500° C., and a pressure was 0 Pa.

In (3) step, a leak detection was performed, that is, whether the vacuum had leak was tested, so as to ensure a process effect before a process gas was introduced, where a time was set to 20 s, a temperature was set to 500° C., and a pressure was 10000 Pa.

In (4) step, vacuumizing was performed, that is, re-vacuumizing was rapidly performed on the furnace tube, where a time was set to 20 s, a temperature was set to 500° C., and a pressure was 0 Pa.

In (5) step, the system entered a pressure equalizing stage, that is, the system was vacuumized to reach a set pressure, and a portion of the process gas was pre-introduced, where a time was set to 20 s, a temperature was set to 500° C., a pressure was 200 Pa, a silane flow was 985 sccm, and a laughing gas flow was 4620 sccm.

In (6) step, silicon oxide was deposited, where a time was set to 80 s, a temperature was set to 500° C., a pressure was set to 200 Pa, an introduced silane flow was 985 sccm, an introduced laughing gas flow was 4620 sccm, a radio frequency power was 12600 W, and a pulse switch ratio was 5/150.

In (7) step, vacuumizing was performed to pump an excess reaction gas to prepare for the next step, where a time was set to 20 s, a temperature was set to 500° C., and a pressure was 0 Pa.

In (8) step, the system entered a pressure equalizing stage, that is, the system was vacuumized to reach a set pressure, and a portion of the process gas was pre-introduced, where a time was set to 20 s, a temperature was set to 500° C., a pressure was 230 Pa, a silane flow was 2200 sccm, and an ammonia flow was 6600 sccm.

In (9) step, a first $SiN_{x1}$ layer having a high refractive index was deposited, where a time was set to 65 s, a temperature was set to 500° C., a pressure was set to 230 Pa, an introduced silane flow was 2200 sccm, an introduced ammonia flow was 6600 sccm, a radio frequency power was 16500 W, and a pulse switch ratio was 5/80.

In (10) step, in a stage of depositing a second $SiN_{x2}$ layer, a time was set to 160 s, a temperature was set to 500° C., a pressure was set to 230 Pa, an introduced silane flow was 1000 sccm, an introduced ammonia flow was 12000 sccm, a radio frequency power was 17500 W, and a pulse switch ratio was 5/80.

In (11) step, in a stage of depositing a third $SiN_{x3}$ layer, a time was set to 250 s, a temperature was set to 500° C., a pressure was set to 230 Pa, an introduced silane flow was 800 sccm, an introduced ammonia flow was 12200 sccm, a radio frequency power was 17500 W, and a pulse switch ratio was 5/80.

In (12) step, in a stage of depositing a $SiO_xN_y$ layer, a time was set to 160 s, a temperature was set to 500° C., a pressure was set to 190 Pa, an introduced silane flow was 1000 sccm, an introduced ammonia flow was 2800 sccm, an introduced laughing gas flow was 7800 sccm, a radio frequency power was 17500 W, and a pulse switch ratio was 5/80.

In (13) step, vacuumizing was performed to pump an excess reaction gas to prepare for the next step, where a time was set to 20 s, a temperature was set to 500° C., and a pressure was 0 Pa.

In (14) step, the system entered a pressure equalizing stage, that is, the system was vacuumized to reach a set pressure, and a portion of the process gas was pre-introduced, where a time was set to 10 s, a temperature was set to 500° C., a pressure was 180 Pa, a silane flow was 600 sccm, and a laughing gas flow was 9600 sccm.

In (15) step, an outermost silicon oxide layer was deposited, where a time was set to 180 s, a temperature was set to 500° C., a pressure was set to 180 Pa, an introduced silane flow was 600 sccm, an introduced laughing gas flow was 9600 sccm, a radio frequency power was 14500 W, and a pulse switch ratio was 5/150.

In (16) step, vacuumizing was performed to pump an excess reaction gas, where a time was set to 25 s, a temperature was set to 500° C., and a pressure was 0 Pa.

In (17) step, the furnace tube was cleaned, and a residual gas in the furnace was purged, where a time was set to 15 s, a temperature was set to 500° C., a pressure was 0 Pa, and a nitrogen flow was 25000 sccm.

In (18) step, vacuumizing was performed to pump an excess reaction gas, where a time was set to 15 s, a temperature was set to 500° C., and a pressure was 0 Pa.

In (19) step, the system was back to normal pressure to prepare for opening a door of the furnace, where a time was set to 90 s, a temperature was set to 500° C., a pressure was 10000 Pa, and a nitrogen flow was 50000 sccm.

In (20) step, the door of the furnace was opened, and the graphite boat was taken out to end the entire front-side PECVD film coating process, where a time was set to 110 s, a temperature was set to 500° C., a pressure was set to 10000 Pa, and a speed of taking out the boat was set to 1000 mm/min.

The bifacial solar cell provided in this example was prepared into a bifacial PERC cell single-glass module, which had a structure of front-plate glass/front-side EVA/cell sheet/back-side white EVA/white back-plate.

Two samples (1# and 2#) were taken out from the above single-glass module for a PID test at a bias voltage of −1500 V. The test results are shown in the following table. A qualification criterion is as follows: the degradation of peak power after 96 h of PID is less than or equal to 3%, and each of the degradation of peak power after 192 h of PID and the degradation of peak power after 288 h of PID is less than or equal to 5%.

TABLE 1

| PID/h | Sample | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|---|
| 0 | 1# | 79.37 | 11.357 | 49.54 | 10.864 | 41.11 | 446.60 | 0.00 | / |
| 96 |  | 79.19 | 11.258 | 49.33 | 10.771 | 40.83 | 439.78 | 1.53 | qualified |
| 192 |  | 79.12 | 11.236 | 49.40 | 10.759 | 40.82 | 439.14 | 1.67 | qualified |
| 288 |  | 79.01 | 11.240 | 49.29 | 10.748 | 40.72 | 437.67 | 2.00 | qualified |
| 0 | 2# | 79.41 | 11.324 | 49.50 | 10.835 | 41.08 | 445.14 | 0.00 | / |
| 96 |  | 78.76 | 11.273 | 49.25 | 10.738 | 40.71 | 437.21 | 1.78 | qualified |
| 192 |  | 78.44 | 11.245 | 49.37 | 10.681 | 40.76 | 435.40 | 2.19 | qualified |
| 288 |  | 78.46 | 11.270 | 49.16 | 10.717 | 40.56 | 434.72 | 2.34 | qualified |

As can be seen from the above table, after 288 h of the −1500 V bias voltage test, the power degradation of the single-glass module can still be maintained less than 2.5%.

FIGS. 5(A) to 5(D) are EL pictures (EL refers to electroluminescence) of 1# at different times, respectively, and FIGS. 6(A) to 6(D) are EL pictures of 2# at different times, respectively. As can be seen from the above figures, from the beginning of the test to 288 h, no apparent failed dark sheet of the cell is seen in the EL pictures.

The bifacial solar cell provided in this example was prepared into a bifacial PERC cell double-glass module, which had a structure of front-plate glass/high-transmittance EVA/cell sheet/transparent POE/back-plate glass.

A sample (3#) was taken out from the above double-glass module for a PID test at a bias voltage of −1500 V. The test results are shown in the following table. A qualification criterion is as follows: the degradation of peak power after 96 h of PID is less than or equal to 3%, and each of the peak power degradation after 192 h of PID and the peak power degradation after 288 h of PID is less than or equal to 5%.

TABLE 2

| PID/h | Sample | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|---|
| 0 | 3# | 79.32 | 11.396 | 49.55 | 10.876 | 41.19 | 447.94 | 0.00 | / |
| 96 |  | 79.14 | 11.345 | 49.42 | 10.829 | 40.98 | 443.71 | 0.94 | qualified |
| 192 |  | 78.98 | 11.349 | 49.48 | 10.819 | 40.99 | 443.48 | 1.00 | qualified |
| 288 |  | 79.06 | 11.336 | 49.47 | 10.829 | 40.94 | 443.35 | 1.03 | qualified |

As can be seen from the above table, after 288 h of the −1500 V bias voltage test, the power degradation of the double-glass module can still be maintained about 1.0%.

FIGS. 7(A) to 7(D) are EL pictures of 3# at different times, respectively. As can be seen from the above figures, from the beginning of the test to 288 h, no apparent failed dark sheet of the cell is seen in the EL pictures.

Example 2

The structure and the material type of the bifacial solar cell provided in this example are the same as those in Example 1. Specific thickness parameters of the bifacial solar cell provided in this example are as follows: the front-side second silicon oxide layer 7 has a refractive index of 1.43 and a thickness of 7 nm; the front-side first nitrogen-containing silicon compound layer 8 has a refractive index of 2.1 and a thickness of 23 nm; the front-side third silicon oxide layer 10 has a refractive index of 1.4 and a thickness of 8; the passivation layer 2 has a thickness of 12 nm; the back-side silicon oxide layer 3 has a refractive index of 1.485 and a thickness of 12 nm; and the back-side first nitrogen-containing silicon compound layer 4 has a refractive index of 2.3 and a thickness of 18 nm.

The preparation method of this example differs from Example 1 in that this example has the methods of the back-side growth and the front-side growth described below.

The method of the back-side growth includes the steps described below.

In (1) step, the silicon wafer after the thermal oxidation process was inserted into a graphite boat and sent into an inner tube of a tubular PECVD furnace through a mechanical arm, where a time was set to 110 s, a temperature was set to 310° C., a pressure was set to 10000 Pa, and a speed of sending the boat was set to 1000 mm/min.

In (2) step, the mechanical arm was pulled from the furnace tube, the furnace tube was closed and at the same time, a temperature was set to 310° C., and a vacuumizing test, a leak detection and a pressure maintaining test were performed.

In (3) step, the system entered a constant temperature and constant pressure stage, where a time was set to 10 s, a temperature was set to 310° C., a pressure was set to 1450 Pa, and an introduced laughing gas flow was 5800 sccm.

In (4) step, the system entered a deposition stage of aluminum oxide, where a time was set to 170 s, a temperature was set to 310° C., a pressure was set to 1450 Pa, an introduced laughing gas flow was 5800 sccm, an opening degree of TMA was 75%, a radio frequency power was 7000 W, and a pulse switch ratio was 20/1000.

In (5) step, vacuumizing was performed to evacuate the remaining gas after the reaction, where a time was set to 45 s, a temperature was set to 470° C., and a pressure was set to 0 Pa.

In (6) step, the system entered a second constant temperature and constant pressure stage, where a time was set to 9 s, a temperature was set to 470° C., a pressure was set to 850 Pa, an introduced ammonia flow was 2500 sccm, and an introduced laughing gas flow was 2500 sccm.

In (7) step, an activation pretreatment process of aluminum oxide was performed, that is, partial ion implantation of H passivation was performed on the aluminum oxide grown in step (4), where a time was set to 340 s, a temperature was set to 470° C., a pressure was set to 850 Pa, an introduced ammonia flow was 2500 sccm, an introduced laughing gas flow was 2500 sccm, a radio frequency power was 3500 W, and a pulse switch ratio was 30/120.

In (8) step, the system entered a growth stage of silicon oxide, where a time was set to 75 s, a temperature was set to 470° C., a pressure was set to 1450 Pa, an introduced silane flow was 650 sccm, an introduced laughing gas flow was 5200 sccm, a radio frequency power was 8000 W, and a pulse switch ratio was 36/1000.

In (9) step, vacuumizing was performed to evacuate the remaining gas after the reaction, where a time was set to 290 s, a temperature was set to 470° C., and a pressure was set to 0 Pa.

In (10) step, the system entered a third constant temperature and constant pressure stage, where a time was set to 9 s, a temperature was set to 470° C., a pressure was set to 1650 Pa, an introduced silane flow was 1250 sccm, and an introduced ammonia flow was 4880 sccm.

In (11) step, the system entered a growth stage of a first $SiN_{x1}$ layer having a high refractive index, where a time was set to 235 s, a temperature was set to 470° C., a pressure was set to 1650 Pa, an introduced silane flow was 1250 sccm, an introduced ammonia flow was 4880 sccm, a radio frequency power was 13000 W, and a pulse switch ratio was 50/700.

In (12) step, the system entered a growth stage of a second $SiN_{x2}$ layer, where a time was set to 125 s, a temperature was set to 470° C., a pressure was set to 1650 Pa, an introduced silane flow was 850 sccm, an introduced ammonia flow was 6000 sccm, a radio frequency power was 13000 W, and a pulse switch ratio was 50/600.

In (13) step, the system entered a growth stage of a third $SiN_{x3}$ layer, where a time was set to 125 s, a temperature was set to 470° C., a pressure was set to 1650 Pa, an introduced silane flow was 600 sccm, an introduced ammonia flow was 6500 sccm, a radio frequency power was 13000 W, and a pulse switch ratio was 50/600.

In (14) step, after the process was completed, the system entered a stage of vacuumizing and filling with nitrogen back to normal pressure, where a time was set to 150 s, a temperature was set to 430° C., a pressure was set to 10000 Pa, and an introduced nitrogen flow was 40000 sccm.

In (15) step, a door of the furnace was opened, and the boat was taken out to end the entire back-side PECVD film coating process, where a time was set to 110 s, a temperature was set to 430° C., a pressure was set to 10000 Pa, and a speed of taking out the boat was set to 1000 mm/min.

The method of the front-side growth includes the steps described below.

In (1) step, a boat was sent into a furnace, that is, the silicon wafer was placed on a graphite holder and sent into a tubular PECVD film coating device through a mechanical arm, where a time was set to 120 s, a temperature was set to 4900° C., and a pressure was 10000 Pa.

In (2) step, vacuumizing was performed, that is, vacuumizing was performed on a furnace tube for the first time, where a time was set to 200 s, a temperature was set to 490° C., and a pressure was 0 Pa.

In (3) step, a leak detection was performed, that is, whether the vacuum had leak was tested, so as to ensure a process effect before a process gas was introduced, where a time was set to 20 s, a temperature was set to 490° C., and a pressure was 10000 Pa.

In (4) step, vacuumizing was performed, that is, re-vacuumizing was rapidly performed on the furnace tube, where a time was set to 20 s, a temperature was set to 490° C., and a pressure was 0 Pa.

In (5) step, the system entered a pressure equalizing stage, that is, the system was vacuumized to reach a set pressure, and a portion of the process gas was pre-introduced, where a time was set to 15 s, a temperature was set to 490° C., a pressure was 195 Pa, a silane flow was 985 sccm, and a laughing gas flow was 4620 sccm.

In (6) step, silicon oxide was deposited, where a time was set to 75 s, a temperature was set to 450° C., a pressure was set to 195 Pa, an introduced silane flow was 985 sccm, an introduced laughing gas flow was 4620 sccm, a radio frequency power was 12600 W, and a pulse switch ratio was 5/150.

In (7) step, vacuumizing was performed to pump an excess reaction gas to prepare for the next step, where a time was set to 15 s, a temperature was set to 500° C., and a pressure was 0 Pa.

In (8) step, the system entered a pressure equalizing stage, that is, the system was vacuumized to reach a set pressure, and a portion of the process gas was pre-introduced, where a time was set to 15 s, a temperature was set to 490° C., a pressure was 225 Pa, a silane flow was 2200 sccm, and an ammonia flow was 6600 sccm.

In (9) step, a first $SiN_{x1}$ layer having a high refractive index was deposited, where a time was set to 60 s, a temperature was set to 450° C., a pressure was set to 225 Pa, an introduced silane flow was 2200 sccm, an introduced ammonia flow was 6600 sccm, a radio frequency power was 16500 W, and a pulse switch ratio was 5/80.

In (10) step, in a stage of depositing a second $SiN_{x2}$ layer, a time was set to 155 s, a temperature was set to 490° C., a pressure was set to 225 Pa, an introduced silane flow was 1000 sccm, an introduced ammonia flow was 12000 sccm, a radio frequency power was 17500 W, and a pulse switch ratio was 5/80.

In (11) step, in a stage of depositing a third $SiN_{x3}$ layer, a time was set to 240 s, a temperature was set to 490° C., a pressure was set to 225 Pa, an introduced silane flow was 800 sccm, an introduced ammonia flow was 12200 sccm, a radio frequency power was 17500 W, and a pulse switch ratio was 5/80.

In (12) step, in a stage of depositing a $SiO_xN_y$ layer, a time was set to 160 s, a temperature was set to 490° C., a pressure was set to 185 Pa, an introduced silane flow was 1000 sccm, an introduced ammonia flow was 2800 sccm, an introduced laughing gas flow was 7800 sccm, a radio frequency power was 17500 W, and a pulse switch ratio was 5/80.

In (13) step, vacuumizing was performed to pump an excess reaction gas to prepare for the next step, where a time was set to 20 s, a temperature was set to 490° C., and a pressure was 0 Pa.

In (14) step, the system entered a pressure equalizing stage, that is, the system was vacuumized to reach a set pressure, and a portion of the process gas was pre-introduced, where a time was set to 10 s, a temperature was set to 490° C., a pressure was 180 Pa, a silane flow was 600 sccm, and a laughing gas flow was 9600 sccm.

In (15) step, an outermost silicon oxide layer was deposited, where a time was set to 175 s, a temperature was set to 490° C., a pressure was set to 175 Pa, an introduced silane flow was 600 sccm, an introduced laughing gas flow was 9600 sccm, a radio frequency power was 14500 W, and a pulse switch ratio was 5/150.

In (16) step, vacuumizing was performed to pump an excess reaction gas, where a time was set to 25 s, a temperature was set to 490° C., and a pressure was 0 Pa.

In (17) step, the furnace tube was cleaned, and a residual gas in the furnace was purged, where a time was set to 15 s, a temperature was set to 490° C., a pressure was 0 Pa, and a nitrogen flow was 25000 sccm.

In (18) step, vacuumizing was performed to pump an excess reaction gas, where a time was set to 15 s, a temperature was set to 490° C., and a pressure was 0 Pa.

In (19) step, the system was back to normal pressure to prepare for opening a door of the furnace, where a time was set to 90 s, a temperature was set to 490° C., a pressure was 10000 Pa, and a nitrogen flow was 50000 sccm.

In (20) step, the door of the furnace was opened, and the graphite boat was taken out to end the entire front-side PECVD film coating process, where a time was set to 110 s, a temperature was set to 490° C., a pressure was set to 10000 Pa, and a speed of taking out the boat was set to 1000 mm/min.

The bifacial solar cell provided in this example was prepared into a bifacial PERC cell single-glass module according to the method of Example 1, and a PID test was performed on this module according to the method of Example 1. The test results are described below.

TABLE 3

| PID/h | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|
| 0 | 79.63 | 11.186 | 41.39 | 10.710 | 34.43 | 368.71 | 0.00 | / |
| 96 | 79.34 | 11.177 | 41.22 | 10.686 | 34.21 | 365.55 | 0.86 | qualified |
| 192 | 79.42 | 11.131 | 41.21 | 10.661 | 34.17 | 364.24 | 1.21 | qualified |

The bifacial solar cell provided in this example was prepared into a bifacial PERC cell double-glass module according to the method of Example 1, and a PID test was performed on this module according to the method of Example 1. The test results are described below.

TABLE 4

| PID/h | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|
| 0 | 79.47 | 11.180 | 41.41 | 10.702 | 34.37 | 367.88 | 0.00 | / |
| 96 | 79.25 | 11.171 | 41.27 | 10.679 | 34.22 | 365.39 | 0.68 | qualified |
| 192 | 79.17 | 11.145 | 41.24 | 10.657 | 34.15 | 363.93 | 1.07 | qualified |

Example 3

The structure and the material type of the bifacial solar cell provided in this example are the same as those in Example 1. Specific thickness parameters of the bifacial solar cell provided in this example are as follows: the front-side second silicon oxide layer 7 has a refractive index of 1.48 and a thickness of 10 nm; the front-side first nitrogen-containing silicon compound layer 8 has a refractive index of 2.4 and a thickness of 20 nm; the front-side third silicon oxide layer 10 has a refractive index of 1.42 and a thickness of 8 nm; the passivation layer 2 has a thickness of 15 nm; the back-side silicon oxide layer 3 has a refractive index of 1.48 and a thickness of 15 nm; and the back-side first nitrogen-containing silicon compound layer 4 has a refractive index of 2.4 and a thickness of 20 nm.

A method of the back-side growth includes the steps described below.

In (1) step, the silicon wafer after the thermal oxidation process was inserted into a graphite boat and sent into an inner tube of a tubular PECVD furnace through a mechanical arm, where a time was set to 110 s, a temperature was set to 330° C., a pressure was set to 10000 Pa, and a speed of sending the boat was set to 1000 mm/min.

In (2) step, the mechanical arm was pulled from the furnace tube, the furnace tube was closed and at the same time, a temperature was set to 330° C., and a vacuumizing test, a leak detection and a pressure maintaining test were performed.

In (3) step, the system entered a constant temperature and constant pressure stage, where a time was set to 11 s, a temperature was set to 330° C., a pressure was set to 1550 Pa, and an introduced laughing gas flow was 5800 sccm.

In (4) step, the system entered a deposition stage of aluminum oxide, where a time was set to 190 s, a temperature was set to 330° C., a pressure was set to 1550 Pa, an introduced laughing gas flow was 5800 sccm, an opening degree of TMA was 75%, a radio frequency power was 7000 W, and a pulse switch ratio was 20/1000.

In (5) step, vacuumizing was performed to evacuate the remaining gas after the reaction, where a time was set to 50 s, a temperature was set to 490° C., and a pressure was set to 0 Pa.

In (6) step, the system entered a second constant temperature and constant pressure stage, where a time was set to 11 s, a temperature was set to 490° C., a pressure was set to 950 Pa, an introduced ammonia flow was 2500 sccm, and an introduced laughing gas flow was 2500 sccm.

In (7) step, an activation pretreatment process of aluminum oxide was performed, that is, partial ion implantation of H passivation was performed on the aluminum oxide grown in step (4), where a time was set to 360 s, a temperature was set to 490° C., a pressure was set to 950 Pa, an introduced ammonia flow was 2500 sccm, an introduced laughing gas flow was 2500 sccm, a radio frequency power was 3500 W, and a pulse switch ratio was 30/120.

In (8) step, the system entered a growth stage of silicon oxide, where a time was set to 85 s, a temperature was set to 490° C., a pressure was set to 1550 Pa, an introduced silane flow was 650 sccm, an introduced laughing gas flow was 5200 sccm, a radio frequency power was 8000 W, and a pulse switch ratio was 36/1000.

In (9) step, vacuumizing was performed to evacuate the remaining gas after the reaction, where a time was set to 300 s, a temperature was set to 490° C., and a pressure was set to 0 Pa.

In (10) step, the system entered a third constant temperature and constant pressure stage, where a time was set to 11 s, a temperature was set to 490° C., a pressure was set to 1800 Pa, an introduced silane flow was 1250 sccm, and an introduced ammonia flow was 4880 sccm.

In (11) step, the system entered a growth stage of a first $SiN_{x1}$ layer having a high refractive index, where a time was set to 245 s, a temperature was set to 490° C., a pressure was set to 1750 Pa, an introduced silane flow was 1250 sccm, an introduced ammonia flow was 4880 sccm, a radio frequency power was 13000 W, and a pulse switch ratio was 50/700.

In (12) step, the system entered a growth stage of a second $SiN_{x2}$ layer, where a time was set to 135 s, a temperature was set to 490° C., a pressure was set to 1750 Pa, an introduced silane flow was 850 sccm, an introduced ammonia flow was 6000 sccm, a radio frequency power was 13000 W, and a pulse switch ratio was 50/600.

In (13) step, the system entered a growth stage of a third $SiN_{x3}$ layer, where a time was set to 135 s, a temperature was set to 490° C., a pressure was set to 1750 Pa, an introduced silane flow was 600 sccm, an introduced ammonia flow was 6500 sccm, a radio frequency power was 13000 W, and a pulse switch ratio was 50/600.

In (14) step, after the process was completed, the system entered a stage of vacuumizing and filling with nitrogen back to normal pressure, where a time was set to 150 s, a temperature was set to 430° C., a pressure was set to 10000 Pa, and an introduced nitrogen flow was 40000 sccm.

In (15) step, a door of the furnace was opened, and the boat was taken out to end the entire back-side PECVD film coating process, where a time was set to 110 s, a temperature was set to 430° C., a pressure was set to 10000 Pa, and a speed of taking out the boat was set to 1000 mm/min.

A method of the front-side growth includes the steps described below.

In (1) step, a boat was sent into a furnace, that is, the silicon wafer was placed on a graphite holder and sent into a tubular PECVD film coating device through a mechanical arm, where a time was set to 120 s, a temperature was set to 510° C., and a pressure was 10000 Pa.

In (2) step, vacuumizing was performed, that is, vacuumizing was performed on a furnace tube for the first time, where a time was set to 200 s, a temperature was set to 510° C., and a pressure was 0 Pa.

In (3) step, a leak detection was performed, that is, whether the vacuum had leak was tested, so as to ensure a process effect before a process gas was introduced, where a time was set to 20 s, a temperature was set to 510° C., and a pressure was 10000 Pa.

In (4) step, vacuumizing was performed, that is, re-vacuumizing was rapidly performed on the furnace tube, where a time was set to 20 s, a temperature was set to 510° C., and a pressure was 0 Pa.

In (5) step, the system entered a pressure equalizing stage, that is, the system was vacuumized to reach a set pressure, and a portion of the process gas was pre-introduced, where a time was set to 25 s, a temperature was set to 510° C., a pressure was 205 Pa, a silane flow was 985 sccm, and a laughing gas flow was 4620 sccm.

In (6) step, silicon oxide was deposited, where a time was set to 85 s, a temperature was set to 510° C., a pressure was set to 205 Pa, an introduced silane flow was 985 sccm, an introduced laughing gas flow was 4620 sccm, a radio frequency power was 12600 W, and a pulse switch ratio was 5/150.

In (7) step, vacuumizing was performed to pump an excess reaction gas to prepare for the next step, where a time was set to 25 s, a temperature was set to 510° C., and a pressure was 0 Pa.

In (8) step, the system entered a pressure equalizing stage, that is, the system was vacuumized to reach a set pressure, and a portion of the process gas was pre-introduced, where a time was set to 25 s, a temperature was set to 510° C., a pressure was 235 Pa, a silane flow was 2200 sccm, and an ammonia flow was 6600 sccm.

In (9) step, a first $SiN_{x1}$ layer having a high refractive index was deposited, where a time was set to 70 s, a temperature was set to 510° C., a pressure was set to 235 Pa, an introduced silane flow was 2200 sccm, an introduced ammonia flow was 6600 sccm, a radio frequency power was 16500 W, and a pulse switch ratio was 5/80.

In (10) step, in a stage of depositing a second $SiN_{x2}$ layer, a time was set to 165 s, a temperature was set to 510° C., a pressure was set to 235 Pa, an introduced silane flow was 1000 sccm, an introduced ammonia flow was 12000 sccm, a radio frequency power was 17500 W, and a pulse switch ratio was 5/80.

In (11) step, in a stage of depositing a third $SiN_{x3}$ layer, a time was set to 260 s, a temperature was set to 510° C., a pressure was set to 235 Pa, an introduced silane flow was 800 sccm, an introduced ammonia flow was 12200 sccm, a radio frequency power was 17500 W, and a pulse switch ratio was 5/80.

In (12) step, in a stage of depositing a $SiO_xN_y$ layer, a time was set to 165 s, a temperature was set to 510° C., a pressure was set to 195 Pa, an introduced silane flow was 1000 sccm, an introduced ammonia flow was 2800 sccm, an introduced laughing gas flow was 7800 sccm, a radio frequency power was 17500 W, and a pulse switch ratio was 5/80.

In (13) step, vacuumizing was performed to pump an excess reaction gas to prepare for the next step, where a time was set to 20 s, a temperature was set to 510° C., and a pressure was 0 Pa.

In (14) step, the system entered a pressure equalizing stage, that is, the system was vacuumized to reach a set pressure, and a portion of the process gas was pre-introduced, where a time was set to 15 s, a temperature was set to 510° C., a pressure was 185 Pa, a silane flow was 600 sccm, and a laughing gas flow was 9600 sccm.

In (15) step, an outermost silicon oxide layer was deposited, where a time was set to 185 s, a temperature was set to 510° C., a pressure was set to 185 Pa, an introduced silane flow was 600 sccm, an introduced laughing gas flow was 9600 sccm, a radio frequency power was 14500 W, and a pulse switch ratio was 5/150.

In (16) step, vacuumizing was performed to pump an excess reaction gas, where a time was set to 25 s, a temperature was set to 510° C., and a pressure was 0 Pa.

In (17) step, the furnace tube was cleaned, and a residual gas in the furnace was purged, where a time was set to 15 s, a temperature was set to 510° C., a pressure was 0 Pa, and a nitrogen flow was 25000 sccm.

In (18) step, vacuumizing was performed to pump an excess reaction gas, where a time was set to 15 s, a temperature was set to 510° C., and a pressure was 0 Pa.

In (19) step, the system was back to normal pressure to prepare for opening a door of the furnace, where a time was set to 90 s, a temperature was set to 510° C., a pressure was 10000 Pa, and a nitrogen flow was 50000 sccm.

In (20) step, the door of the furnace was opened, and the graphite boat was taken out to end the entire front-side PECVD film coating process, where a time was set to 110 s, a temperature was set to 510° C., a pressure was set to 10000 Pa, and a speed of taking out the boat was set to 1000 mm/min.

The bifacial solar cell provided in this example was prepared into a bifacial PERC cell single-glass module according to the method of Example 1, and a PID test was performed on this module according to the method of Example 1. The test results are described below.

TABLE 5

| PID/h | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|
| 0 | 80.40 | 11.379 | 41.67 | 10.898 | 34.98 | 381.19 | 0.00 | / |
| 96 | 80.13 | 11.319 | 41.53 | 10.822 | 34.81 | 376.66 | 1.19 | qualified |
| 192 | 79.47 | 11.291 | 41.25 | 10.718 | 34.54 | 370.19 | 2.89 | qualified |

The bifacial solar cell provided in this example was prepared into a bifacial PERC cell double-glass module according to the method of Example 1, and a PID test was performed on this module according to the method of Example 1. The test results are described below.

TABLE 6

| PID/h | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|
| 0 | 80.39 | 11.412 | 41.82 | 10.930 | 35.10 | 383.68 | 0.00 | / |
| 96 | 79.85 | 11.358 | 41.65 | 10.842 | 34.84 | 377.71 | 1.56 | qualified |
| 192 | 78.96 | 11.345 | 41.45 | 10.701 | 34.70 | 371.33 | 3.22 | qualified |

Example 4

The bifacial solar cell provided in this example differs from that in Example 1 only in that the back-side silicon oxide layer 3 has a refractive index of 1.2.

The bifacial solar cell provided in this example was prepared into a bifacial PERC cell single-glass module according to the method of Example 1, and a PID test was performed on this module according to the method of Example 1. The test results are described below.

TABLE 7

| PID/h | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|
| 0 | 80.22 | 11.481 | 41.78 | 10.976 | 35.05 | 384.74 | 0.00 | / |
| 96 | 79.21 | 11.409 | 41.53 | 10.806 | 34.73 | 375.31 | 2.45 | qualified |
| 192 | 75.26 | 11.395 | 41.13 | 10.363 | 34.04 | 352.75 | 8.31 | unqualified |

The bifacial solar cell provided in this example was prepared into a bifacial PERC cell double-glass module according to the method of Example 1, and a PID test was performed on this module according to the method of Example 1. The test results are described below.

TABLE 8

| PID/h | Fill Factor/ % | Short Circuit Current/ A | Open Circuit Voltage/ V | Peak Current/ A | Peak Voltage/ V | Peak Power/ W | Degradation of Peak Power/% | Whether Qualified |
|---|---|---|---|---|---|---|---|---|
| 0 | 79.45 | 10.938 | 41.28 | 10.464 | 34.29 | 358.80 | 0.00 | / |
| 96 | 78.05 | 10.568 | 39.66 | 10.053 | 32.53 | 327.08 | 8.84 | unqualified |
| 192 | 78.22 | 10.544 | 39.63 | 10.072 | 32.45 | 326.83 | 8.91 | unqualified |

Example 5

The bifacial solar cell provided in this example differs from that in Example 1 only in that the back-side silicon oxide layer 3 has a thickness of 4 nm. The bifacial solar cell provided in this example was prepared into a bifacial PERC cell single-glass module according to the method of Example 1, and a PID test was performed on this module according to the method of Example 1. The test results are described below.

TABLE 9

| PID/h | Fill Factor/ % | Short Circuit Current/ A | Open Circuit Voltage/ V | Peak Current/ A | Peak Voltage/ V | Peak Power/ W | Degradation of Peak Power/% | Whether Qualified |
|---|---|---|---|---|---|---|---|---|
| 0 | 80.31 | 11.460 | 41.81 | 10.969 | 35.08 | 384.79 | 0.00 | / |
| 96 | 79.66 | 11.398 | 41.55 | 10.847 | 34.78 | 377.28 | 1.95 | qualified |
| 192 | 78.13 | 11.380 | 41.30 | 10.660 | 34.45 | 367.18 | 4.58 | unqualified |

The bifacial solar cell provided in this example was prepared into a bifacial PERC cell double-glass module according to the method of Example 1, and a PID test was performed on this module according to the method of Example 1. The test results are described below.

TABLE 10

| PID/h | Fill Factor/ % | Short Circuit Current/ A | Open Circuit Voltage/ V | Peak Current/ A | Peak Voltage/ V | Peak Power/ W | Degradation of Peak Power/% | Whether Qualified |
|---|---|---|---|---|---|---|---|---|
| 0 | 79.49 | 10.953 | 41.26 | 10.476 | 34.29 | 359.24 | 0.00 | / |
| 96 | 78.77 | 10.543 | 39.77 | 10.105 | 32.68 | 330.26 | 8.07 | unqualified |
| 192 | 78.71 | 10.553 | 39.74 | 10.122 | 32.61 | 330.05 | 8.13 | unqualified |

Example 6

The bifacial solar cell provided in this example differs from that in Example 1 only in that the back-side first nitrogen-containing silicon compound layer 4 has a refractive index of 1.8.

The bifacial solar cell provided in this example was prepared into a bifacial PERC cell single-glass module according to the method of Example 1, and a PID test was performed on this module according to the method of Example 1. The test results are described below.

TABLE 11

| PID/h | Fill Factor/ % | Short Circuit Current/ A | Open Circuit Voltage/ V | Peak Current/ A | Peak Voltage/ V | Peak Power/ W | Degradation of Peak Power/% | Whether Qualified |
|---|---|---|---|---|---|---|---|---|
| 0 | 80.39 | 11.412 | 41.82 | 10.930 | 35.10 | 383.68 | 0.00 | / |
| 96 | 79.85 | 11.358 | 41.65 | 10.842 | 34.84 | 377.71 | 1.56 | qualified |
| 192 | 78.94 | 11.299 | 41.13 | 10.675 | 34.37 | 366.87 | 4.38 | unqualified |

The bifacial solar cell provided in this example was prepared into a bifacial PERC cell double-glass module according to the method of Example 1, and a PID test was performed on this module according to the method of Example 1. The test results are described below.

TABLE 12

| PID/h | Fill Factor/ % | Short Circuit Current/ A | Open Circuit Voltage/ V | Peak Current/ A | Peak Voltage/ V | Peak Power/ W | Degradation of Peak Power/% | Whether Qualified |
|---|---|---|---|---|---|---|---|---|
| 0 | 79.56 | 10.935 | 41.27 | 10.468 | 34.30 | 359.05 | 0.00 | / |
| 96 | 78.32 | 10.460 | 39.29 | 9.986 | 32.23 | 321.87 | 10.36 | unqualified |
| 192 | 78.57 | 10.420 | 39.26 | 9.980 | 32.21 | 321.46 | 10.47 | unqualified |

Example 7

The bifacial solar cell provided in this example differs from that in Example 1 only in that the back-side first nitrogen-containing silicon compound layer 4 has a thickness of 4 nm.

The bifacial solar cell provided in this example was prepared into a bifacial PERC cell single-glass module according to the method of Example 1, and a PID test was performed on this module according to the method of Example 1. The test results are described below.

TABLE 13

| PID/h | Fill Factor/ % | Short Circuit Current/ A | Open Circuit Voltage/ V | Peak Current/ A | Peak Voltage/ V | Peak Power/ W | Degradation of Peak Power/% | Whether Qualified |
|---|---|---|---|---|---|---|---|---|
| 0 | 80.32 | 11.444 | 41.69 | 10.962 | 34.95 | 374.20 | 0.00 | / |
| 96 | 78.46 | 11.368 | 41.27 | 10.683 | 34.46 | 363.25 | 2.93 | qualified |
| 192 | 77.90 | 11.299 | 41.03 | 10.594 | 34.09 | 353.85 | 5.74 | unqualified |

The bifacial solar cell provided in this example was prepared into a bifacial PERC cell double-glass module according to the method of Example 1, and a PID test was performed on this module according to the method of Example 1. The test results are described below.

TABLE 14

| PID/h | Fill Factor/ % | Short Circuit Current/ A | Open Circuit Voltage/ V | Peak Current/ A | Peak Voltage/ V | Peak Power/ W | Degradation of Peak Power/% | Whether Qualified |
|---|---|---|---|---|---|---|---|---|
| 0 | 79.63 | 10.954 | 41.29 | 10.480 | 34.37 | 360.19 | 0.00 | / |
| 96 | 78.32 | 10.476 | 39.35 | 9.979 | 32.35 | 322.81 | 10.38 | unqualified |
| 192 | 78.28 | 10.453 | 39.42 | 9.975 | 32.34 | 322.57 | 10.44 | unqualified |

Comparative Example 1

The bifacial solar cell provided in this comparative example differs from that in Example 1 only in that the no back-side silicon oxide layer 3 is included.

The bifacial solar cell provided in this example was prepared into a bifacial PERC cell single-glass module according to the method of Example 1, and a PID test was performed on this module according to the method of Example 1. The test results are described below.

TABLE 15

| PID/h | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|
| 0 | 41.18 | 34.200 | 11.46 | 10.942 | 79.28 | 374.20 | 0.00 | / |
| 96 | 40.76 | 33.520 | 11.36 | 10.689 | 77.40 | 358.25 | 4.26 | unqualified |
| 192 | 40.76 | 33.520 | 11.27 | 10.556 | 77.06 | 353.85 | 5.44 | unqualified |

The bifacial solar cell provided in this example was prepared into a bifacial PERC cell double-glass module according to the method of Example 1, and a PID test was performed on this module according to the method of Example 1. The test results are described below.

TABLE 16

| PID/h | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|
| 0 | 40.95 | 33.850 | 11.36 | 10.818 | 78.73 | 366.18 | 0.00 | / |
| 96 | 40.21 | 32.940 | 11.15 | 10.604 | 77.89 | 349.23 | 4.63 | unqualified |
| 192 | 39.78 | 32.440 | 10.85 | 10.365 | 77.89 | 336.26 | 8.17 | unqualified |

Comparative Example 2

The bifacial solar cell provided in this comparative example differs from that in Example 1 only in that the no back-side first nitrogen-containing silicon compound layer 4 is included.

The bifacial solar cell provided in this example was prepared into a bifacial PERC cell single-glass module according to the method of Example 1, and a PID test was performed on this module according to the method of Example 1. The test results are described below.

TABLE 17

| PID/h | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|
| 0 | 41.17 | 34.170 | 11.47 | 10.932 | 79.14 | 373.57 | 0.00 | / |
| 96 | 40.86 | 33.630 | 11.34 | 10.714 | 77.75 | 360.31 | 3.55 | unqualified |
| 192 | 40.80 | 33.500 | 11.27 | 10.467 | 76.24 | 350.65 | 6.14 | unqualified |

The bifacial solar cell provided in this example was prepared into a bifacial PERC cell double-glass module according to the method of Example 1, and a PID test was performed on this module according to the method of Example 1. The test results are described below.

TABLE 18

| PID/h | Fill Factor/% | Short Circuit Current/A | Open Circuit Voltage/V | Peak Current/A | Peak Voltage/V | Peak Power/W | Degradation of Peak Power/% | Whether Qualified |
|---|---|---|---|---|---|---|---|---|
| 0 | 40.93 | 33.830 | 11.37 | 10.832 | 78.73 | 366.46 | 0.00 | / |
| 96 | 40.22 | 33.010 | 11.16 | 10.623 | 78.11 | 350.72 | 4.30 | unqualified |
| 192 | 39.61 | 32.270 | 10.93 | 10.393 | 77.44 | 335.35 | 8.49 | unqualified |

In view of the data of the preceding examples and comparative examples, it can be seen that the bifacial solar cells provided in Examples 1 to 3 each adopt a special design of a layered film structure (including a multilayer design of a front-side film and a multilayer design of a back-side film, where the back-side silicon oxide layer and the back-side first nitrogen-containing silicon compound layer are the most critical structures for solving back-side PID of the bifacial PERC cell), which enhances the compactness and electrical characteristics of a comprehensive film and can slow down an occurrence of the back-side PID very effectively.

In Example 4, since the back-side silicon oxide layer 3 has a relatively low refractive index, the film is not compact enough, resulting in a damage to the passivation layer on the back side by $Na^+$ ions.

In Example 5, since the back-side silicon oxide layer 3 has a relatively low thickness, the film is relatively thin, which easily causes a damage to the passivation layer on the back side by $Na^+$ ions.

In Example 6, since the back-side first nitrogen-containing silicon compound layer 4 has a relatively low refractive index, the film is not compact enough, resulting in a damage to the passivation layer on the back side by $Na^+$ ions.

In Example 7, since the back-side first nitrogen-containing silicon compound layer 4 has a relatively low thickness, the film is relatively thin, which easily causes a damage to the passivation layer on the back side by $Na^+$ ions.

In Comparative Example 1, since the no back-side silicon oxide layer 3 is included, no protective film serves to block, resulting in a damage to the passivation layer on the back side by $Na^+$ ions.

In Comparative Example 2, since the no back-side first nitrogen-containing silicon compound layer 4 is included, no protective film serves to block, resulting in a damage to the passivation layer on the back side by $Na^+$ ions.

The applicant has stated that although the detailed method of the present application is described through the examples described above, the present application is not limited to the detailed method described above, which means that the implementation of the present application does not necessarily depend on the detailed method described above.

What is claimed is:

1. A bifacial solar cell, comprising a silicon wafer having a PN junction, and a front-side first silicon oxide layer, a front-side second silicon oxide layer, a front-side first nitrogen-containing silicon compound layer, a front-side second nitrogen-containing silicon compound layer and a front-side third silicon oxide layer that are located on the N-type side of the silicon wafer and stacked in sequence in a direction away from the silicon wafer; a passivation layer, a back-side silicon oxide layer, a back-side first nitrogen-containing silicon compound layer and a back-side second nitrogen-containing silicon compound layer that are located on the P-type side of the silicon wafer and stacked in sequence in the direction away from the silicon wafer, wherein each of the front-side first nitrogen-containing silicon compound layer and the back-side first nitrogen-containing silicon compound layer is a $SiN_{x1}$ layer, wherein x1 is independently 0.75 to 1.34, and wherein the front-side second nitrogen containing silicon compound layer is a $SiN_{x2}/SiN_{x3}/SiO_xN_y$ stacked structure stacked in sequence in the direction away from the silicon wafer, and the back-side second nitrogen-containing silicon compound layer is a $SiN_{x2}/SiN_{x3}$ stacked structure stacked in sequence in the direction away from the silicon wafer, wherein x2 is 0.75 to 1.34,
x3 is 0.75 to 1.34,
x is 1 to 2,
y is 1 to 2, and
x1>x2>x3.

2. The bifacial solar cell according to claim 1, wherein each of the front-side first silicon oxide layer, the front-side second silicon oxide layer, the front-side third silicon oxide layer and the back-side silicon oxide layer is a $SiO_2$ layer.

3. The bifacial solar cell according to claim 1, wherein the front-side second silicon oxide layer, the front-side third silicon oxide layer and the back-side silicon oxide layer are electrodeposited silicon oxide layers.

4. The bifacial solar cell according to claim 1, wherein the front-side first silicon oxide layer is a thermal silicon oxide layer.

5. The bifacial solar cell according to claim 1, wherein the front-side second silicon oxide layer has a refractive index of 1.4 or more.

6. The bifacial solar cell according to claim 1, wherein the passivation layer has a thickness of 10 nm or more.

7. The bifacial solar cell according to claim 1, wherein the passivation layer is an aluminum oxide layer.

8. The bifacial solar cell according to claim 1, wherein the bifacial solar cell further comprises a silver electrode.

9. The bifacial solar cell according to claim 1, wherein a silver electrode on the N-type side of the silicon wafer passes through the front-side first silicon oxide layer, the front-side second silicon oxide layer, the front-side first nitrogen-containing silicon compound layer, the front-side second nitrogen-containing silicon compound layer and the front-side third silicon oxide layer.

10. The bifacial solar cell according to claim 1, wherein a silver electrode on the P-type side of the silicon wafer passes through the back-side silicon oxide layer, the back-side first nitrogen-containing silicon compound layer and the back-side second nitrogen-containing silicon compound layer.

11. The bifacial solar cell according to claim 1, wherein the front-side second silicon oxide layer has a thickness of 5 nm or more.

12. The bifacial solar cell according to claim 1, wherein the front-side first nitrogen-containing silicon compound layer has a refractive index of 2.0 or more.

13. The bifacial solar cell according to claim 1, wherein the front-side first nitrogen-containing silicon compound layer has a thickness of 15 nm or more.

14. The bifacial solar cell according to claim 1, wherein the front-side third silicon oxide layer has a refractive index of 1.4 or more.

15. The bifacial solar cell according to claim 1, wherein the front-side third silicon oxide layer has a thickness of 5 nm or more.

16. The bifacial solar cell according to claim 1, wherein the back-side silicon oxide layer has a refractive index of 1.4 or more.

17. The bifacial solar cell according to claim 1, wherein the back-side silicon oxide layer has a thickness of 5 nm or more.

18. The bifacial solar cell according to claim 1, wherein the back-side first nitrogen-containing silicon compound layer has a refractive index of 2.0 or more.

19. The bifacial solar cell according to claim 1, wherein the back-side first nitrogen-containing silicon compound layer has a thickness of 10 nm or more.

* * * * *